(12) United States Patent
Park et al.

(10) Patent No.: US 9,379,042 B2
(45) Date of Patent: Jun. 28, 2016

(54) INTEGRATED CIRCUIT DEVICES HAVING THROUGH SILICON VIA STRUCTURES AND METHODS OF MANUFACTURING THE SAME

(71) Applicants: Jae-Hwa Park, Yongin-si (KR); Suk-Chul Bang, Yongin-si (KR); Byung-Lyul Park, Seoul (KR); Kwang-Jin Moon, Hwaseong-si (KR)

(72) Inventors: Jae-Hwa Park, Yongin-si (KR); Suk-Chul Bang, Yongin-si (KR); Byung-Lyul Park, Seoul (KR); Kwang-Jin Moon, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/504,647

(22) Filed: Oct. 2, 2014

(65) Prior Publication Data
US 2015/0108605 A1 Apr. 23, 2015

(30) Foreign Application Priority Data
Oct. 15, 2013 (KR) ........................ 10-2013-0122955

(51) Int. Cl.
| H01L 21/02 | (2006.01) |
| H01L 23/48 | (2006.01) |
| H01L 49/02 | (2006.01) |
| H01L 21/768 | (2006.01) |
| H01L 27/108 | (2006.01) |
| H01L 23/522 | (2006.01) |
| H01L 23/538 | (2006.01) |

(52) U.S. Cl.
CPC ........ *H01L 23/481* (2013.01); *H01L 21/76898* (2013.01); *H01L 27/10817* (2013.01); *H01L 27/10823* (2013.01); *H01L 27/10855* (2013.01); *H01L 27/10888* (2013.01); *H01L 27/10894* (2013.01); *H01L 27/10897* (2013.01); *H01L 28/87* (2013.01); *H01L 28/91* (2013.01); *H01L 23/522* (2013.01); *H01L 23/5384* (2013.01); *H01L 27/10814* (2013.01); *H01L 2924/0002* (2013.01)

(58) Field of Classification Search
None
See application file for complete search history.

(56) References Cited

U.S. PATENT DOCUMENTS

| 8,149,585 | B2 | 4/2012 | Kawano | |
| 8,173,541 | B2 | 5/2012 | Andry et al. | |
| 2001/0025973 | A1* | 10/2001 | Yamada | H01L 21/763 257/296 |
| 2007/0241380 | A1* | 10/2007 | Hasunuma | H01L 27/0207 257/296 |
| 2010/0164062 | A1 | 7/2010 | Wang et al. | |
| 2011/0095373 | A1* | 4/2011 | Hwang | H01L 21/76898 257/368 |
| 2011/0183488 | A1* | 7/2011 | Takaishi | H01L 21/76816 438/381 |
| 2011/0207322 | A1* | 8/2011 | Yamaguchi | H01L 21/76898 438/667 |
| 2012/0007154 | A1 | 1/2012 | Lin et al. | |
| 2012/0049299 | A1 | 3/2012 | Chou | |
| 2012/0091520 | A1* | 4/2012 | Nakamura | H01L 21/76898 257/303 |
| 2012/0292782 | A1 | 11/2012 | Lee et al. | |
| 2013/0075905 | A1 | 3/2013 | Choi et al. | |

\* cited by examiner

*Primary Examiner* — Benjamin Sandvik
*Assistant Examiner* — Herve Assouman
(74) *Attorney, Agent, or Firm* — Myers Bigel & Sibley, P.A.

(57) ABSTRACT

An integrated circuit device is provided. The integrated circuit device includes: a capacitor including an electrode formed in a first area on a substrate; a through-silicon-via (TSV) landing pad formed in a second area on the substrate, the TSV landing pad including the same material as the electrode; a multi-layered interconnection structure formed on the capacitor and the TSV landing pad; and a TSV structure passing through the substrate, the TSV structure being connected to the multi-layered interconnection structure through the TSV landing pad.

19 Claims, 22 Drawing Sheets

INTEGRATED CIRCUIT DEVICES HAVING THROUGH SILICON VIA STRUCTURES AND METHODS OF MANUFACTURING THE SAME

CROSS-REFERENCE TO RELATED APPLICATION

This application claims the benefit under 35 U.S.C. §119 of Korean Patent Application No. 10-2013-0122955, filed on Oct. 15, 2013, in the Korean Intellectual Property Office, the disclosure of which is incorporated herein in its entirety by reference.

BACKGROUND

The inventive concepts relate to integrated circuit devices and to methods of manufacturing the same, and more particularly, to integrated circuit devices having a through-silicon-via (TSV) structures and to methods of manufacturing such integrated circuit devices.

Three-dimensional (3D) packages in which a plurality of semiconductor chips are mounted in a single semiconductor package are being developed. These 3D packages may use TSV technology for forming a vertical electrical connection through a substrate or a die. Device fabrication technology that provides devices with TSV structures that exhibit stable operational characteristics and high reliability are desired to improve the performance and reliability of existing 3D packages.

SUMMARY

Embodiments of the inventive concepts provide integrated circuit devices having a reliable interconnection structure between a multi-layered interconnection structure formed on a substrate and a TSV structure passing through the substrate.

Embodiments of the inventive concepts also provide methods of manufacturing integrated circuit devices which may connect a multi-layered interconnection structure, which is formed on a substrate, to a TSV structure, which is formed from a back side of the substrate toward the inside of the substrate, without causing a problem such a contact defect due to process variation.

According to an aspect of the inventive concept, there is provided an integrated circuit device including: an integrated circuit device including: a capacitor comprising an electrode on a substrate; a through-silicon-via (TSV) landing pad on the substrate, the TSV landing pad comprising the same material as the electrode; a multi-layered interconnection structure on the TSV landing pad; and a TSV structure passing through the substrate, the TSV structure being connected to the multi-layered interconnection structure through the TSV landing pad.

The capacitor may include a lower electrode connected to an active region of the substrate, an upper electrode on the lower electrode, and a dielectric film interposed between the lower electrode and the upper electrode, wherein the TSV landing pad includes the same material as the upper electrode.

The integrated circuit device may further include a bit line between the substrate and the capacitor on the substrate, wherein a thickness of the TSV landing pad is larger than a thickness of the bit line.

The TSV landing pad may only include a single layer.

The TSV landing pad may include a multi-layer landing pad in which at least two conductive layers are stacked.

The electrode and the TSV landing pad each may include a non-metallic conductive material layer.

The electrode and the TSV landing pad each may include a first non-metallic conductive layer and a second conductive layer that includes at least one metal, wherein the first conductive layer is closer to the substrate compared to the second conductive layer. The first conductive layer may be interposed between the substrate and the second conductive layer.

The TSV landing pad may extend over a first range in the second area on the substrate, and the TSV structure may be connected to the TSV landing pad within a second range, which is included in the first range, in the second area on the substrate.

The TSV structure may have an upper surface having a first portion that directly contacts the TSV landing pad and a second portion spaced apart from the TSV landing pad.

At least a portion of the TSV landing pad may include a mesh pattern.

At least a portion of the TSV landing pad may include a plurality of spaced apart patterns.

The integrated circuit device may further include a contact plug connected between an interconnection line of the multi-layered interconnection structure and the TSV landing pad.

The integrated circuit device may further include a TSV area dielectric film formed on a surface of the TSV landing pad that faces the substrate, wherein the TSV area dielectric film comprises the same material as a dielectric film of the capacitor.

According to another aspect of the inventive concept, there is provided an integrated circuit device including: a substrate comprising first and second areas having different pattern formation densities; a first insulating layer on the first area of the substrate; a second insulating layer on the second area of the substrate; a capacitor on the first insulating layer; a through-silicon-via (TSV) landing pad on the second insulating layer, the TSV landing pad including the same material as an electrode of the capacitor; a multi-layered interconnection structure on the TSV landing pad; and a TSV structure passing through the substrate and the second insulating layer, the TSV structure being connected to the multi-layered interconnection structure through the TSV landing pad.

The first area may be a memory cell array area, and the second area may be a TSV area that is spaced apart from the memory cell array area.

According to another aspect of the inventive concept, there is provided an integrated circuit device including: a substrate having a device region and a through-silicon-via (TSV) region; a plurality of capacitors on the substrate in the device region, the capacitors having first electrodes, and a common second electrode; a TSV landing pad on the substrate in the TSV region, the TSV landing pad formed of the same material as the common second electrode; a first contact plug on the common second electrode opposite the substrate; a second contact plug on the TSV landing pad opposite the substrate; and a TSV structure passing through the substrate to connect to the TSV landing pad.

The common second electrode may be a multi-layer electrode that includes a first non-metallic layer and a second metal-containing layer that is on the first non-metallic layer opposite the substrate. The first non-metallic layer may be a SiGe layer. A portion of the second electrode in the device region may have a thickness that is substantially equal to a thickness of the TSV landing pad. One of the first non-metallic layer and the second metal-containing layer may be a continuous layer and the other of the first non-metallic layer and the second metal-containing layer may be a discontinuous layer.

A central portion of a first side of the TSV landing pad that is closest to the substrate may be recessed.

According to another aspect of the inventive concept, there is provided a method of manufacturing an integrated circuit device, the method including: forming a capacitor lower electrode in a first area on a substrate; forming a dielectric film covering a surface of the capacitor lower electrode; forming an upper electrode layer covering the capacitor lower electrode while interposing the dielectric film therebetween, the upper electrode layer being formed in both the first area and in a second area that is adjacent to the first area; patterning the upper electrode layer to form a capacitor upper electrode in the first area and to form a through-silicon-via (TSV) landing pad in the second area; and forming a TSV structure that passes through the substrate in the second area and that is connected to the TSV landing pad.

The forming of the upper electrode layer may include forming a non-metallic conductive layer on the substrate in the first and second areas.

The forming of the upper electrode layer may include: forming a first conductive layer, which comprises a non-metal, on the substrate in the first and second areas; and forming a second conductive layer, which comprises a metal, on the first conductive layer in the first and second areas.

The TSV landing pad may includes at least a first non-metal conductive layer, and wherein forming the TSV structure comprises: etching a portion of the substrate to form a via hole that exposes a surface of the first non-metal conductive layer; and forming the TSV structure in the via hole to directly contact the first non-metal conductive layer.

The method may further include forming a multi-layered interconnection structure before forming the TSV structure after forming the TSV landing pad, wherein the multi-layered interconnection structure comprises a first interconnection layer, which is connected to the capacitor upper electrode, and at least one second interconnection layer that is connected to the TSV landing pad.

The method may further include forming a plurality of contact plugs, which are connected to the TSV landing pad and which are spaced apart from one another, before forming the multi-layered interconnection structure and after forming the TSV landing pad, wherein the at least one second interconnection layer is are connected to the plurality of contact plugs.

According to another aspect of the inventive concept, there is provided a method of manufacturing an integrated circuit device, the method including: forming a capacitor lower electrode that is electrically connected to an active region in a memory cell array area of a substrate; forming a dielectric film on the memory cell area and on a through-silicon-via (TSV) area of the substrate, the dielectric film covering the capacitor lower electrode; forming an upper electrode layer on the dielectric film in the memory cell array area and on the dielectric film in the TSV area of the substrate; patterning the upper electrode layer to form a capacitor upper electrode, which covers the capacitor lower electrode while interposing a portion of the dielectric film therebetween, in the memory cell array area and to form a TSV landing pad, which covers another portion of the dielectric film, in the TSV area; and forming a TSV structure that passes through the substrate in the TSV area and is connected to the TSV landing pad.

The method may further include forming a bit line having a first thickness on the substrate in the memory cell array area, wherein the upper electrode layer has a second thickness that is larger than the first thickness.

The patterning of the upper electrode layer may include forming the TSV landing pad of which at least a portion comprises a mesh pattern.

The patterning of the upper electrode layer may include forming the TSV landing pad of which at least a portion comprises a plurality of patterns spaced apart from one another.

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION OF THE EMBODIMENTS

Figure 1:
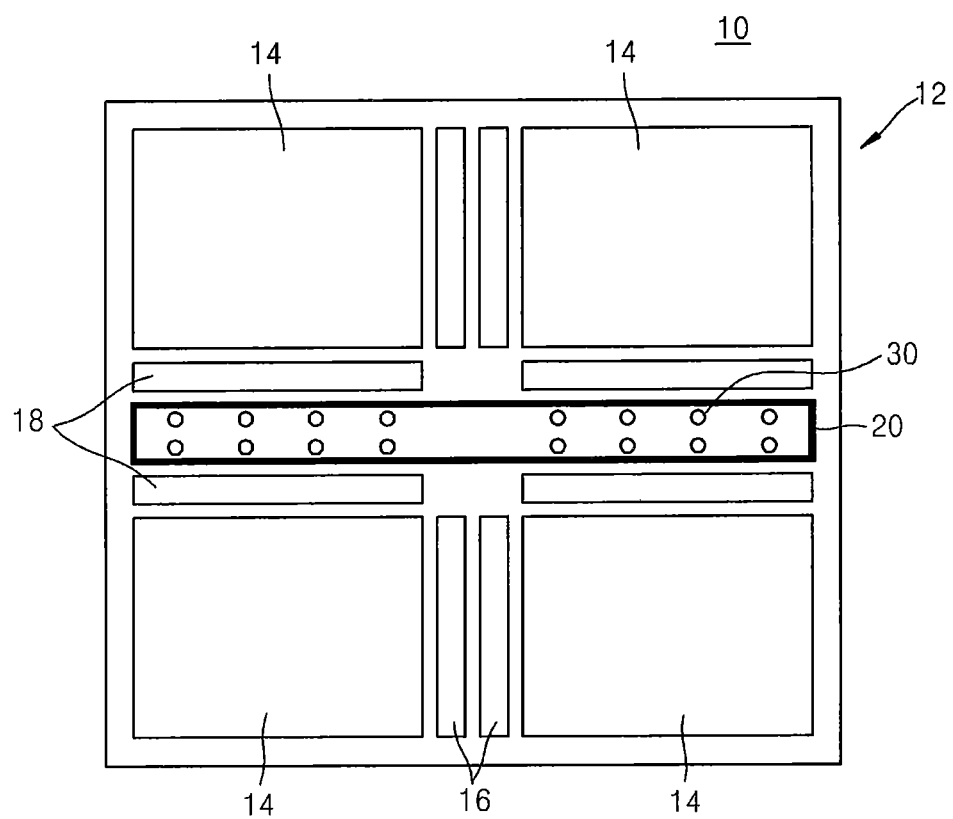
FIG. 1 is a schematic plan view illustrating a configuration of an integrated circuit device according to an embodiment of the inventive concepts.

The inventive concepts now will be described more fully hereinafter with reference to the accompanying drawings, in which embodiments of the inventive concepts are shown. The inventive concepts may, however, be embodied in many different forms and should not be construed as limited to the exemplary embodiments set forth herein. Rather, these embodiments are provided so that this disclosure will be thorough and complete, and will fully convey the scope of the inventive concepts to one of ordinary skill in the art. In the drawings and description that follow, like reference numerals refer to like elements.

As used herein, the term "and/or" includes any and all combinations of one or more of the associated listed items. Expressions such as "at least one of," when preceding a list of elements, modify the entire list of elements.

It will be understood that, although the terms first, second, third, etc., may be used herein to describe various elements, components or regions, these elements, components and/or regions should not be limited by these terms. These terms are only used to distinguish one element, component or region from another element, component or region. Thus, a first element, component or region discussed below could be termed a second element, component or region without departing from the teachings of the inventive concepts. For example, a first element may be named a second element and similarly a second element may be named a first element without departing from the scope of the inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the description of example embodiments that follows, processing steps may be described as being performed in a certain order. It will be appreciated that in other embodiments the order may be changed. For example, while herein first and second processes may be described as being performed sequentially in a certain order, it will be appreciated that in other embodiments these two processes may be performed in reverse order or may be performed substantially simultaneously.

It will also be appreciated that variations from the shapes of various of the elements illustrated in the drawings as a result, for example, of manufacturing techniques and/or tolerances, are to be expected. Thus, exemplary embodiments should not be construed as limited to the particular shapes of regions illustrated in the drawings but may include deviations in shapes that result, for example, from manufacturing.

FIG. 1 is a schematic plan view illustrating a configuration of an integrated circuit device 10 according to an embodiment of the inventive concepts.

As shown in FIG. 1, a memory chip 12 of the integrated circuit device 10 includes a plurality of memory blocks 14. Each of the plurality of memory blocks 14 may include a plurality of memory cells. A plurality of word lines, a plurality of bit lines, a sense amplifier, and the like may be included in each of the memory blocks 14. A plurality of column decoders 16, a plurality of row decoders 18, and a through-silicon-via (TSV) area 20 that includes one or more TSV structures 30 are disposed around and/or between ones of the plurality of memory blocks 14. The column decoders 16 may receive addresses and may decode the received addresses to select column lines of the memory blocks 14. The row decoders 18 may receive addresses and may decode the received addresses to output row addresses for selecting row lines of the memory blocks 14. The memory chip 12 may further include a write driver, an input/output (I/O) sense amplifier, and an input/output (I/O) buffer. The I/O buffer of the memory chip 12 may receive a signal from the outside through a TSV structure 30 or may transmit a signal to the outside through the TSV structure 30.

The TSV area 20 may be positioned in a middle portion of the memory chip 12. A plurality of TSV structures 30 may be disposed in the TSV area 20.

Figure 2:
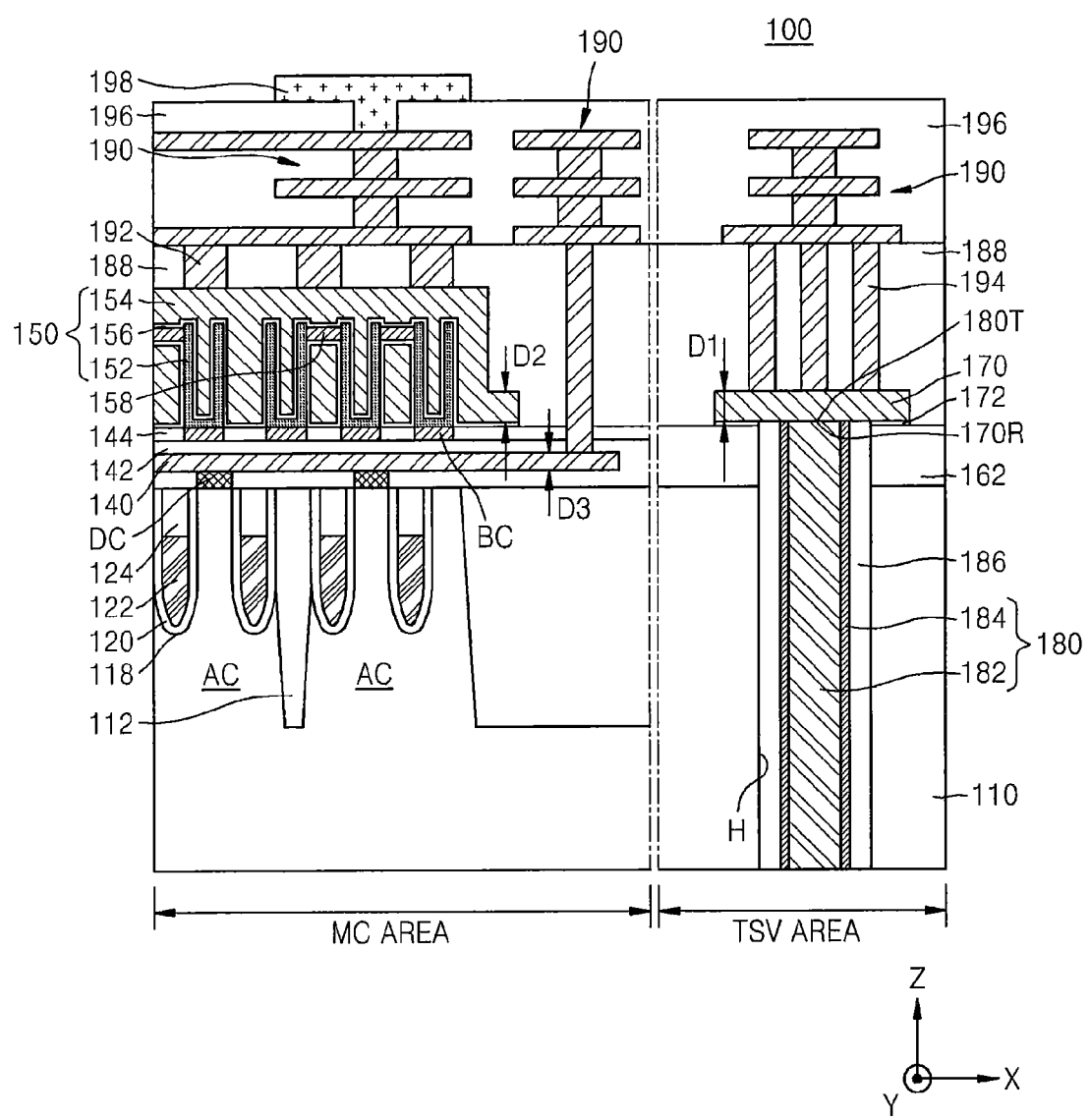
FIG. 2 is a cross-sectional view illustrating an integrated circuit device according to an embodiment of the inventive concepts.

FIG. 2 is a cross-sectional view of an integrated circuit device 100 according to an embodiment of the inventive concepts.

Referring to FIG. 2, a substrate 110 of the integrated circuit device 100 includes a memory cell array area (hereinafter, referred to as "MC area") having a relatively high pattern formation density and a TSV area having a pattern formation density that is lower than that of the MC area.

The MC area of FIG. 2 may correspond to some elements of the plurality of memory blocks 14 of FIG. 1. The TSV area of FIG. 2 may correspond to some elements of the TSV area 20 of FIG. 1.

In the MC area, a plurality of active regions AC are defined in the substrate 110 by a device isolation layer 112.

In some embodiments, the substrate 110 includes silicon (Si). In other embodiments, the substrate 110 may include a different semiconductor element, such as germanium (Ge), or may be a compound semiconductor, such as silicon carbide (SiC), gallium arsenide (GaAs), indium arsenide (InAs), or indium phosphide (InP). The substrate 110 may have a silicon on insulator (SOI) structure. For example, the substrate 110 may include a buried oxide (BOX) layer. In some embodiments, the substrate 110 may have a conductive region, for example, an impurity-doped well, or an impurity-doped structure. In addition, the substrate 110 may have various isolation structures, such as a shallow trench isolation (STI) structure. The device isolation layer 112 may comprise at least part of the STI structure, if an STI structure is included.

A plurality of gate dielectric films 120, a plurality of word lines 122, and a plurality of buried insulating layers 124 are sequentially formed inside a plurality of word line trenches 118 in the MC area of the substrate 110.

The gate dielectric films 120 may each include at least one selected from a silicon oxide film, a silicon nitride film, a silicon oxynitride film, an oxide/nitride/oxide (ONO) film, or a high-k dielectric film having a dielectric constant that is higher than the dielectric constant of a silicon oxide film. The word lines 122 may each include at least one material selected from Ti, TiN, Ta, TaN, W, WN, TiSiN, and WSiN. The buried insulating layers 124 may each comprise, for example, a silicon oxide film, a silicon nitride film, a silicon oxynitride film, or a combination thereof.

A bit line 140, which is connected to an active region AC of the substrate 110 through a plurality of direct contacts DC, is formed on the substrate 110. A plurality of buried contacts BC, which are connected to the active region AC of the substrate 110, are formed on a first insulating layer 142 that covers the bit line 140. The buried contacts BC may be insulated from one another by a second insulating layer 144.

The direct contacts DC may be formed of polysilicon, metal, conductive metal nitride, or a combination thereof.

The bit line 140 may include at least one material selected from a semiconductor doped with impurities, a metal, a conductive metal nitride, and a metal silicide. For example, the bit line 140 may be formed of doped polysilicon, TiN, TiSiN, W, tungsten silicide, or a combination thereof.

The buried contacts BC may be formed of a semiconductor doped with impurities, a metal, a conductive metal nitride, or a combination thereof.

The first insulating layer 142 and the second insulating layer 144 may each be an oxide layer, a nitride layer, or a combination thereof. For example, the first insulating layer 142 and the second insulating layer 144 may each be formed of tetraethylorthosilicate (TEOS), high density plasma (HDP), or boro-phospho silicate glass (BPSG), but are not limited thereto.

A plurality of capacitors 150 that are connected to respective ones of the buried contacts BC are formed on the second insulating layer 144. Each of the capacitors 150 includes a lower electrode 152, an upper electrode 154, and a dielectric film 156 interposed between the lower electrode 152 and the upper electrode 154. Adjacent lower electrodes 152 may be supported by an insulating support 158 formed therebetween.

The upper electrode 154 may have a thickness of about tens of nanometers (nm) to about hundreds of nm and may cover the lower electrodes 152. For example, resistance characteristics that may be specified or required for the upper electrode 154 may be obtained by making the thickness of the upper electrode 154 relatively large. In some embodiments, the upper electrode 154 may have a thickness of about 100 nm or more. In some embodiments, the upper electrode 154 may have a thickness that is larger than the thickness of the bit line 140.

The lower electrode 152 may be formed of a metal, a conductive metal nitride, or a combination thereof. For example, the lower electrode 152 may be formed of TiN, Ru, TaN, WN, Pt, Ir, or a combination thereof.

The insulating support 158 may be formed of SiO, SiN, SiCN, SiOC, SiON, SiOCN, or a combination thereof.

The upper electrode 154 may be formed of a metal or a non-metallic conductive material. In some embodiments, the upper electrode 154 may be formed of SiGe, W, Ti, Ru, a conductive metal nitride, a metal silicide, or a combination thereof. The upper electrode 154 may include a single layer or multiple layers such as two stacked conductive layers. FIG. 2 illustrates an embodiment in which the upper electrode 154 includes a single layer.

The dielectric film 156 may be formed of tantalum oxide ($Ta_2O_5$), aluminum oxide ($Al_2O_3$), titanium oxide ($TiO_2$), or a combination thereof, but is not limited thereto.

In the TSV area, a third insulating layer 162 is formed on the substrate 110. The third insulating layer 162 may be an oxide layer, a nitride layer, or a combination thereof. For example, the third insulating layer 162 may be formed of TEOS, HDP, or BPSG, but is not limited thereto.

A TSV landing pad 170 is formed on the third insulating layer 162. The TSV landing pad 170 is formed of a material that is the same as the material that is used to form the upper electrode 154 of the capacitors 150 that are formed in the MC area. When the upper electrode 154 includes a single layer as illustrated in FIG. 2, the TSV landing pad 170 may also include a single layer. In some embodiments, the TSV landing pad 170 and the upper electrode 154 may each be formed of SiGe.

A TSV area dielectric film 172 may be interposed between the third insulating layer 162 and the TSV landing pad 170. The TSV area dielectric film 172 may be formed of the same material as the dielectric film 156 of the capacitors 150 formed in the MC area.

The TSV landing pad 170 may be formed simultaneously with the upper electrode 154. In some embodiments, a thickness D1 of the TSV landing pad 170 may be substantially the same as a thickness D2 of the upper electrode 154. The thickness D1 of the TSV landing pad 170 may be larger than a thickness D3 of the bit line 140 that is formed in the MC area.

In some embodiments, the thickness D1 of the TSV landing pad 170 and the thickness D2 of the upper electrode 154 may each be at least 100 nm. However, the inventive concepts are not limited thereto.

A TSV structure 180 that extends through the substrate 110 and the third insulating layer 162 is connected to the TSV landing pad 170. The TSV structure 180 may form the TSV structure 30 of FIG. 1.

The TSV structure 180 may include a conductive plug 182 and a conductive barrier film 184 that surrounds the conductive plug 182. In some embodiments, the conductive plug 182 may include Cu or W. For example, the conductive plug 182 may be formed of CuSn, CuMg, CuNi, CuZn, CuPd, CuAu, CuRe, CuW, W, or W alloy. However, the inventive concepts are not limited thereto. The conductive barrier film 184 may be a single film or multiple films including at least one material selected from, for example, W, WN, WC, Ti, TiN, Ta, TaN, Ru, Co, Mn, WN, Ni, and NiB.

The TSV structure 180 is surrounded by a via insulating layer 186, which extends through the substrate 110 and the third insulating layer 162. The TSV structure 180 may be spaced apart from the substrate 110 and the third insulating layer 162 by the via insulating layer 186.

The via insulating layer 186 may be an oxide layer, a nitride layer, a carbide layer, a polymer layer, or a combination thereof. The via insulating layer 186 may, in some embodiments, have a cylindrical structure surrounding the TSV structure 180. In some embodiments, the via insulating layer 186 may have a thickness of about 500 Å to about 2500 Å. However, the present invention is not limited thereto.

The TSV structure 180 and the via insulating layer 186 are formed inside a via hole H, which extends through the substrate 110 and the third insulating layer 162.

Figure 3:
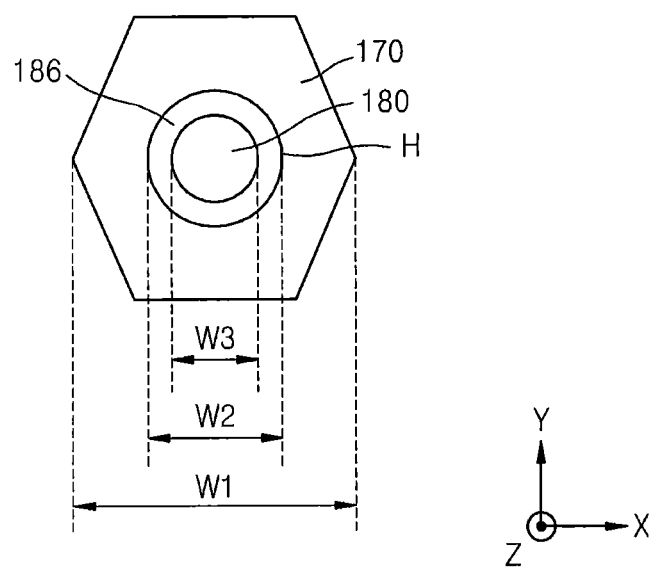
FIG. 3 is a plan view showing an exemplary through-silicon-via (TSV) landing pad of an integrated circuit device according to an embodiment of the inventive concepts.

FIG. 3 is a plan view showing exemplary shapes of the TSV landing pad 170, the TSV structure 180, and the via insulating layer 186 of FIG. 2.

Referring to FIG. 3, a width W1 of the TSV landing pad 170 is larger than a width W2 of the via hole H in a direction (for example, the X direction of FIGS. 2 and 3) that is parallel to a direction in which a main surface of the substrate 110 extends. The TSV landing pad 170 may extend over a first range that is defined by the width W1 in the TSV area on the substrate 110, and the via hole H may be formed so as to have the width W2 that is smaller than the width W1 of the TSV landing pad 170 to expose the TSV landing pad 170 within a second range that is included in the first range in which the TSV landing pad 170 is formed. The TSV structure 180 that is formed inside the via hole H may be connected to the TSV landing pad 170 within a third range that is included in the first range and the second range. To this end, the TSV structure 180 may be formed so as to have a width W3 that is smaller than the width W1 of the TSV landing pad 170 and the width W2 of the via hole H.

Referring back to FIG. 2, a recess surface 170R that communicates with the via hole H may be formed in the bottom surface of the TSV landing pad 170. In some embodiments, the recess surface 170R may be formed by over-etching when forming the via hole H. In some other embodiments, the recess surface 170R may not be formed in the TSV landing pad 170.

The TSV structure 180 has an upper surface 180T that contacts the TSV landing pad 170. In some embodiments, the entire area of the upper surface 180T of the TSV structure 180 may contact the TSV landing pad 170. In other embodiments, only a portion of the upper surface 180T of the TSV structure 180 may contact the TSV landing pad 170. In this case, a portion of the upper surface 180T which does not contact the TSV landing pad 170 may contact a portion of a fourth insulating layer 188. More detailed configurations of the TSV structure 180 will be described herein with reference to FIGS. 5A through 5D.

The capacitors 150 and the TSV landing pad 170 are each covered by the fourth insulating layer 188. In the MC area and the TSV area, a multi-layered interconnection structure 190 is formed on the fourth insulating layer 188. The multi-layered interconnection structure 190 may be insulated from other adjacent interconnection lines by a fifth insulating layer 196.

The fourth insulating layer 188 and the fifth insulating layer 196 may each be an oxide layer, a nitride layer, or a combination thereof.

In the MC area, a plurality of contact plugs 192 are formed between the capacitors 150 and the multi-layered interconnection structure 190. In the TSV area, a plurality of contact plugs 194 are formed between the TSV landing pad 170 and the multi-layered interconnection structure 190.

A plurality of contact holes are formed in the fourth insulating layer 188 for the contact plugs 192, 194 by etching the fourth insulating layer 188. These contact holes may have a relatively large difference in depth, which is about several micrometers (μm). In order to form contact holes having such a large difference in depth, a material having an excellent etch selectivity with respect to the fourth insulating layer 188 may be used as the constituent material of the upper electrode 154. For example, the fourth insulating layer 188 may be an oxide layer, and the upper electrode 154 may be formed of SiGe. When the upper electrode 154 is formed of SiGe, the upper electrode 154 may be formed so as to have a thickness of about 100 nm in order to secure a desired resistance characteristics for the upper electrode 154.

The TSV structure 180 is connected to an interconnection line of the multi-layered interconnection structure 190 through the TSV landing pad 170. As illustrated in FIG. 2, the contact plugs 194 may be connected between any one interconnection line of the multi-layered interconnection structure 190 and the TSV landing pad 170.

A connecting pad 198 may be connected to an uppermost interconnection line of the multi-layered interconnection structure 190. Although one connecting pad 198 that is formed in the MC area is illustrated in FIG. 2, the inventive concepts are not limited thereto. For example, the integrated circuit device 100 may include a plurality of connecting pads 198 in each of the MC area and the TSV area.

Figure 4:
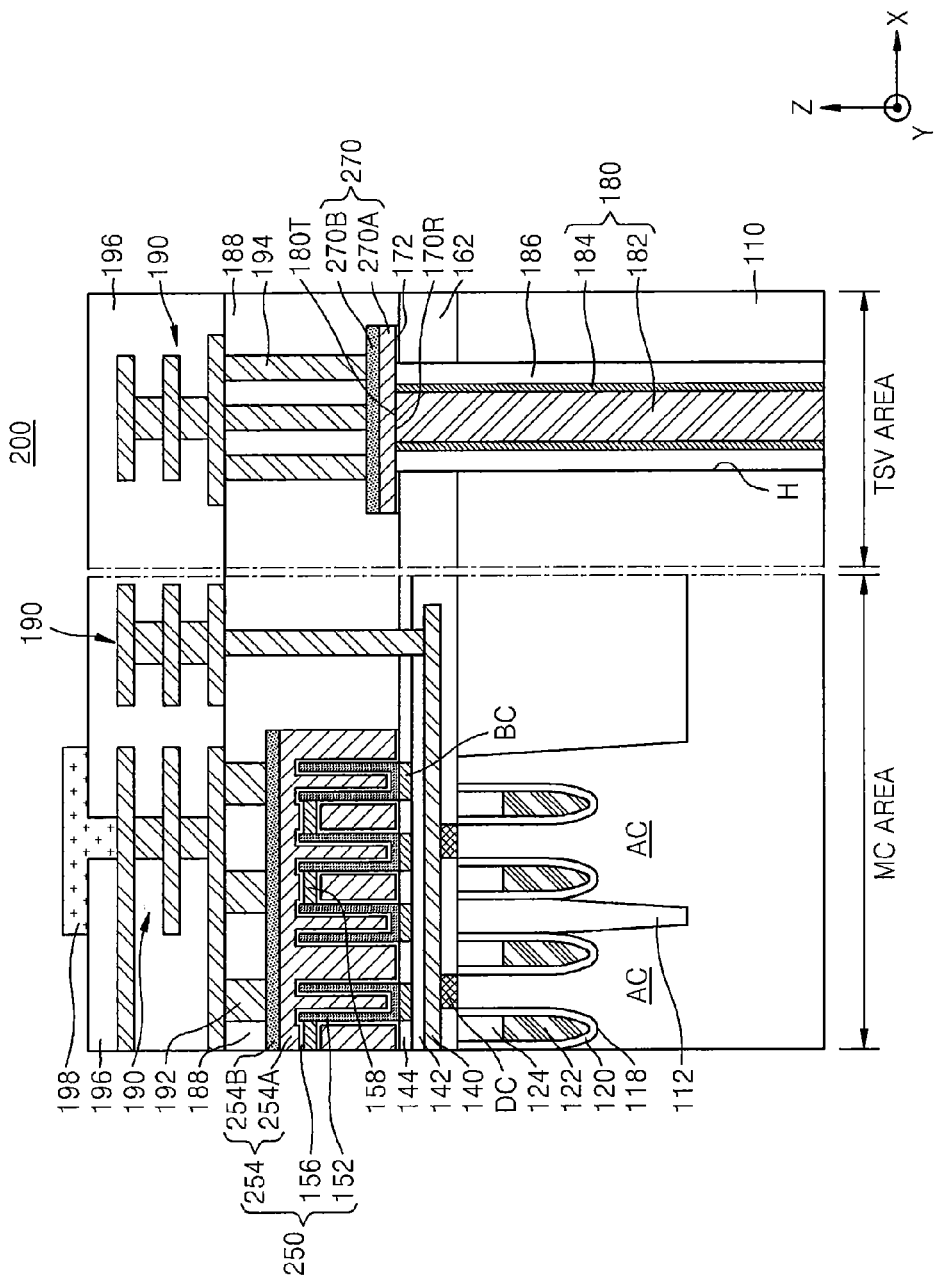
FIG. 4 is a cross-sectional view illustrating an integrated circuit device according to another embodiment of the inventive concepts.

FIG. 4 is a cross-sectional view illustrating an integrated circuit device 200 according to another embodiment of the inventive concepts. In FIG. 4, the same reference numerals are used to denote the same elements as in FIG. 2, and hence a detailed description of the same elements will be omitted.

Referring to FIG. 4, capacitors 250 that are formed in an MC area of the integrated circuit device 200 have substantially the same configuration as the capacitors 150 of the integrated circuit device 100 illustrated in FIG. 2, except that an upper electrode 254 of the capacitors 250 includes a double layer, which includes a first conductive layer 254A and a second conductive layer 254B.

In addition, a TSV landing pad 270 that is formed in the TSV area has substantially the same configuration as the TSV landing pad 170 illustrated in FIG. 2, except that the TSV landing pad 270 includes a double layer, which includes a first pad layer 270A formed of the same material as the first conductive layer 254A and a second pad layer 270B formed of the same material as the second conductive layer 254B.

In some embodiments, the first conductive layer 254A and the first pad layer 270A may each be a non-metallic conductive layer, and the second conductive layer 254B and the second pad layer 270B may each be formed of a metal, a conductive metal nitride, a metal silicide, or a combination thereof. For example, the first conductive layer 254A and the first pad layer 270A may be formed of SiGe, and the second conductive layer 254B and the second pad layer 270B may each include at least one conductive material selected from W, Ni, and silicides thereof.

The first pad layer 270A, which is closer to the substrate 110 than is the second pad layer 270B, may include a non-metallic conductive material. In this case, when etching or over-etching is performed to form the via hole H for the TSV structure 180, the non-metallic conductive material functions as an etch stop layer, and thus, the first pad layer 270A of the TSV landing pad 270, which is formed of the non-metallic conductive material, is exposed through the via hole H. Accordingly, the substrate 110, which is exposed through a side wall of the via hole H during the formation of the via hole H, may not be contaminated by a metal contaminant.

FIGS. 5A through 5D are plan views illustrating landing pad layers 372, 374, 376, and 378 that may be used instead of the TSV landing pad 170 illustrated in FIG. 2, or instead of the first pad layer 270A or the second pad layer 270B which constitute the TSV landing pad 270 illustrated in FIG. 4. The TSV structure 180 and the via insulating layer 186 (refer to FIG. 2 and FIG. 4) are illustrated together with the landing pad layer 372, 374, 376, and 378 in FIGS. 5A through 5D.

As illustrated in FIGS. 5A through 5D, landing pad layers having various plane structures may be used as the first pad layer 270A or the second pad layer 270B.

Figure 5A:
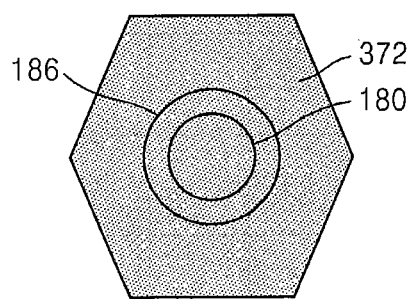
FIGS. 5A through 5D are plan views illustrating various landing pad structures that may be used as a TSV landing pad of an integrated circuit device, according to embodiments of the inventive concepts.

More specifically, in some embodiments, the TSV landing pad 170 illustrated in FIG. 2 and/or the TSV landing pad 270 illustrated in FIG. 4 may each have the same structure as a landing pad layer 372 that is a continuous film-shaped conductive layer which extends seamlessly as illustrated in FIG. 5A.

When the TSV landing pad 170 illustrated in FIG. 2 (or the TSV landing pad 270 illustrated in FIG. 4) has the same structure as the landing pad layer 372 illustrated in FIG. 5A, the entire area of the upper surface 180T of the TSV structure 180 may contact the TSV landing pad 170 (or the TSV landing pad 270).

Although the landing pad layer 372 has a hexagon shape in FIG. 5A, the inventive concepts are not limited thereto. For example, the landing pad layer 372 may have a circular shape, an oval shape, or any one of various polygonal shapes, such as a triangular shape, a tetragonal shape, and the like.

Figure 5B:
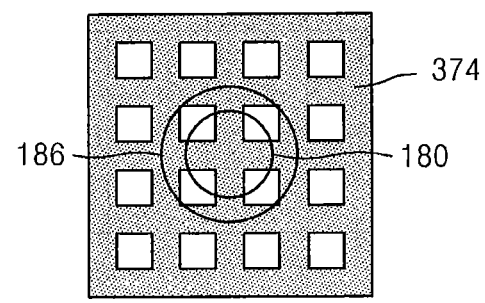

In some other embodiments, the TSV landing pad 170 illustrated in FIG. 2 and/or the TSV landing pad 270 illustrated in FIG. 4 may each have the same structure as a landing pad layer 374 having a mesh-type shape, as illustrated in FIG. 5B.

Although the landing pad layer 374 has a tetragon shape as shown in FIG. 5B, the inventive concepts are not limited thereto. For example, the landing pad layer 374 may have a circular shape, an oval shape, or any one of various polygonal shapes.

Figure 5C:
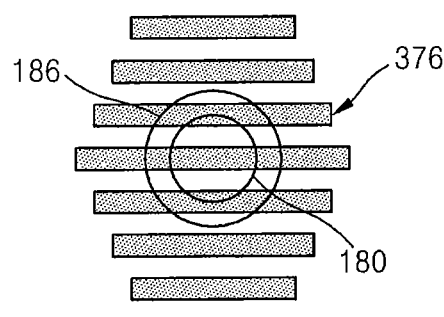

In further embodiments, the TSV landing pad 170 illustrated in FIG. 2 and/or the TSV landing pad 270 illustrated in FIG. 4 may each have the same structure as a landing pad layer 376 having a shape formed of a plurality of spaced apart line patterns, as illustrated in FIG. 5C.

Figure 5D:
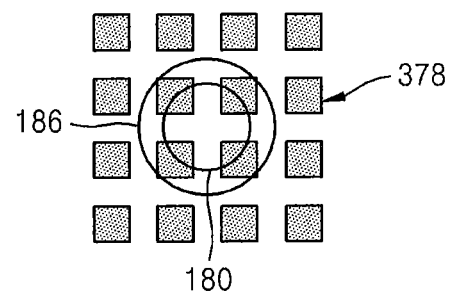

In still further embodiments, the TSV landing pad 170 illustrated in FIG. 2 and/or the TSV landing pad 270 illustrated in FIG. 4 may each have the same structure as a landing pad layer 378 having a plane shape formed of a plurality of island patterns that are spaced apart from one another, as illustrated in FIG. 5D.

When the TSV landing pad 170 illustrated in FIG. 2 (or the TSV landing pad 270 illustrated in FIG. 4) has the same structure as any one of the landing pad layers 374, 376, and 378 illustrated in FIGS. 5B through 5D, only a portion of the upper surface 180T of the TSV structure 180 (refer to FIG. 2 and FIG. 4) may contact the landing pad layer 374, 376, or 378. A portion of the upper surface 180T of the TSV structure 180, which does not contact the landing pad layer 374, 376, or 378, may contact a portion of the fourth insulating layer 188 (refer to FIG. 2 and FIG. 4).

In some embodiments, when the TSV landing pad 270 having a double layer structure is adopted as illustrated in FIG. 4, one of the first and second landing pads 270A and 270B may have the same structure as the landing pad layer 372 that is the continuous film-shaped conductive layer as illustrated in FIG. 5A, and the other of the first and second landing pads 270A and 270B may have the same plane structure as any one of the landing pad layers 374, 376, and 378 illustrated in FIGS. 5B through 5D.

When one of the landing pad layers 374, 376, and 378 having a discontinuous plane shape including broken portions or openings in some areas as shown in FIGS. 5B through 5D is adopted as at least a portion of the TSV landing pad 170 illustrated in FIG. 2 or TSV landing pad 270 illustrated in FIG. 4, a contact defect, which may occur if the landing pad layer 374, 376, or 378 separates from the TSV structure 180 due to, for example, a physical stress in the landing pad layer 374, 376, or 378, may be less likely to occur.

In some embodiments, a phenomenon in which the shapes of the landing pad layers 374, 376, and 378 are deformed due to stress may occur, particularly in embodiments in which the landing pad layers 374, 376, and 378 are formed of metal. To reduce or prevent this phenomenon, a TSV landing pad 270 having a double layer may be adopted as illustrated in FIG. 4, where the landing pad layer 372, which is formed of a nonmetallic conductive material such as SiGe and is a continuous film-shaped conductive layer as illustrated in FIG. 5A, may be formed as the first pad layer 270A of the TSV landing pad 270, and a landing pad layer, which is formed of a metal such W and has the same plane structure as any one of the landing pad layers 374, 376, and 378 illustrated in FIGS. 5B through 5D, may be formed as the second pad layer 270B of the TSV landing pad 270.

FIGS. 6A through 6M are cross-sectional views that illustrate a method of manufacturing an integrated circuit device 400 (refer to FIG. 6M) according to another embodiment of the inventive concepts. In FIGS. 6A through 6M, the same reference numerals are used to denote the same elements as in FIGS. 2 and 4, and thus, detailed descriptions of the same elements will be omitted.

Figure 6A:
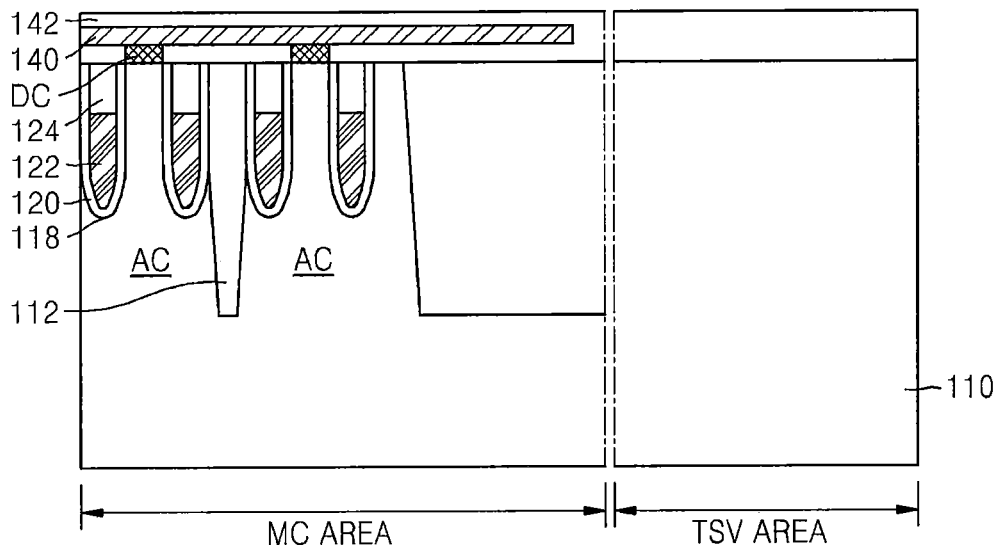
FIGS. 6A through 6M are cross-sectional views that sequentially illustrate a method of manufacturing an integrated circuit device according to an embodiment of the inventive concepts.
Figure 6A:
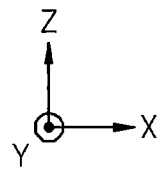

Referring to FIG. 6A, a device isolation layer 112 is formed in a substrate 110 to define a plurality of active regions AC in an MC area.

The plurality of active regions AC may each have the shape of a relatively long island having a short axis and a long axis.

The device isolation layer 112 may be an oxide layer, a nitride layer, or a combination thereof, but is not limited thereto. The device isolation layer 112 may have a single layer structure that includes a single insulating layer or a multiple layer structure that includes a combination of two or more different types of insulating layers.

In the MC area, a plurality of word line trenches 118 are formed in the substrate 110. The word line trenches 118 extend parallel to one another in the Y direction of FIG. 10, and may each have the shape of a line intersecting the plurality of active regions AC. A plurality of gate dielectric films 120, a plurality of word lines 122, and a plurality of buried insulating layers 124 are sequentially formed within the word line trenches 118. Upper surfaces of the plurality of buried insulating layers 124 may be positioned at the same level as an upper surface of the substrate 110.

In some embodiments, after forming the word lines 122, impurity ions may be implanted in the substrate 110 at both sides of each word line 122 to form source and drain regions in upper portions of the active regions AC. In other embodiments, an impurity ion implantation process for forming source and drain regions may be performed before the word lines 122 are formed.

A plurality of direct contacts DC, which are connected to respective ones of the active regions AC, and a bit line 140, which is connected to the active regions AC through the direct contacts DC, are formed in the MC area. The direct contacts DC and the bit line 140 are covered with a first insulating layer 142, and may be insulated from other adjacent conductive layers by the first insulating layer 142.

Figure 6B:
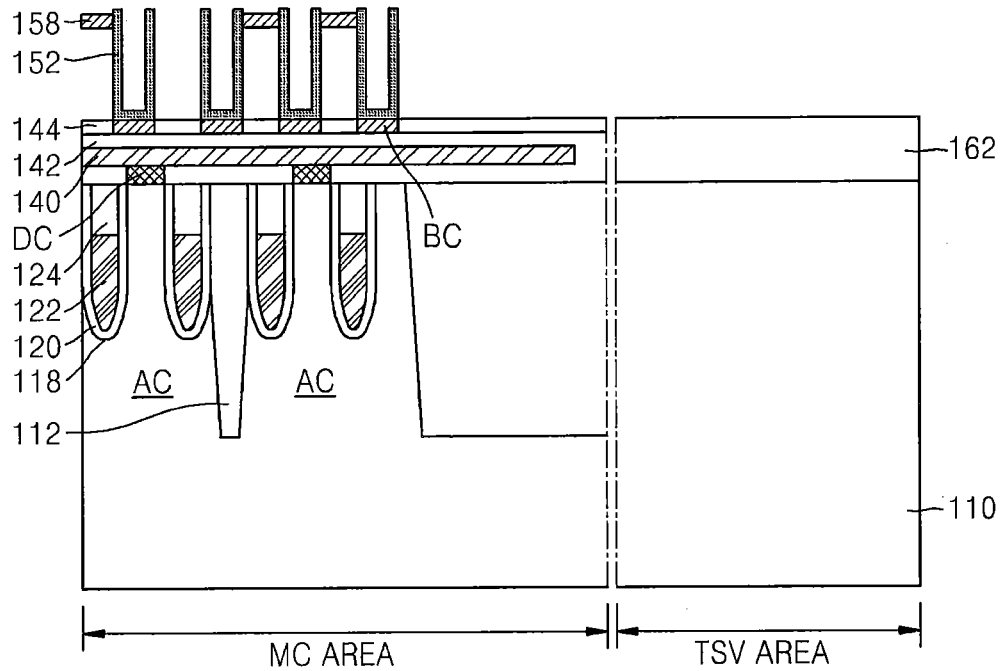
Figure 6B:
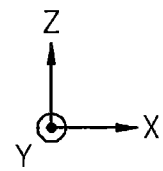

Referring to FIG. 6B, in the MC area, a plurality of buried contacts BC are formed on the first insulating layer 142.

Each of the buried contacts BC may extend toward the substrate in the Z direction at both sides of the bit line 140 to connect to the active regions of the substrate 110. In some embodiments, the buried contacts BC may each have a structure which includes a contact plug that contacts a corresponding active region AC in the substrate 110 and a landing pad that is formed on the contact plug.

The buried contacts BC may be insulated from one another by a second insulating layer 144. In the TSV area, a third insulating layer 162 may be formed at a level above the substrate 110 that corresponds to the first insulating layer 142 and the second insulating layer 144. In some embodiments, the first insulating layer 142, the second insulating layer 144, and the third insulating layer 162 may each be multi-layer structures that each include a plurality of insulating layers.

A plurality of lower electrodes 152 are formed on the buried contacts BC. The lower electrodes 152 may be supported by supports 158.

Figure 6C:
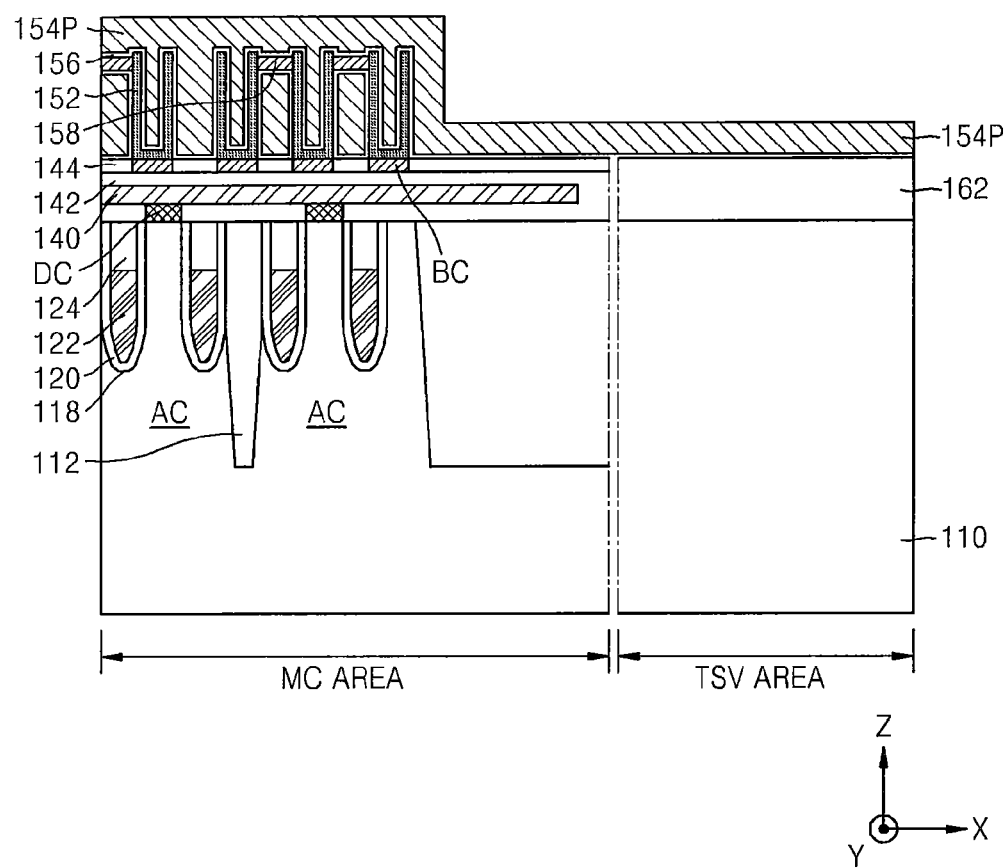

Referring to FIG. 6C, in the MC area, a dielectric film 156 is formed on surfaces of the lower electrodes 152 and the supports 158. The dielectric film 156 is also formed on the third insulating layer 162 in the TSV area.

Next, in the MC area and the TSV area, an upper electrode layer 154P is formed on the dielectric film 156. In the MC area, the upper electrode layer 154P may be formed sufficiently thickly so as to have a height that exceeds the height of the lower electrodes 152 in the vicinity of the lower electrodes 152. In the TSV area, the upper electrode layer 154P may have a thickness of at least 100 nm. However, the inventive concepts are not limited thereto.

In some embodiments, the upper electrode layer 154P may be a single conductive layer. In other embodiments, the upper electrode layer 154P may be a multi-layer electrode having at least two stacked layers.

Figure 6D:
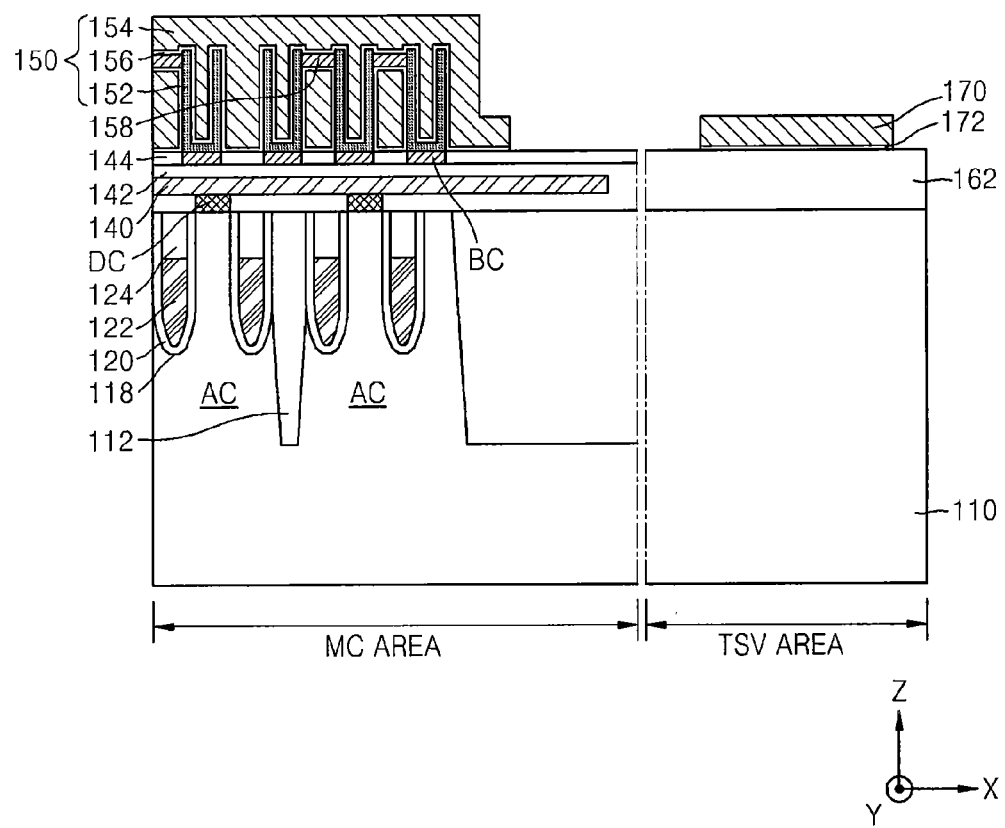

Referring to FIG. 6D, the upper electrode layer 154P and the dielectric film 156 (refer to FIG. 6C) are patterned in the MC area and the TSV area to form a plurality of capacitors 150 from the plurality of lower electrodes 152, the upper electrode 154, and the dielectric film 156 interposed therebetween, and to form the TSV landing pad 170 in the TSV area.

In the TSV area, the dielectric film 156 is partially removed during the patterning process to form a TSV area dielectric film 172 between the TSV landing pad 170 and the third insulating layer 162.

The TSV landing pad 170 may have a structure that is the same as or similar to that of any one of the landing pads 372, 374, 376, and 378 illustrated in FIGS. 5A through 5D.

The TSV area dielectric film 172 is formed of the same material as the dielectric film 156 of the capacitors 150 in the MC area. In some embodiments, the TSV area dielectric film 172 may be formed of tantalum oxide ($Ta_2O_5$), aluminum oxide ($Al_2O_3$), titanium oxide ($TiO_2$), or a combination thereof, but is not limited thereto.

Figure 6E:
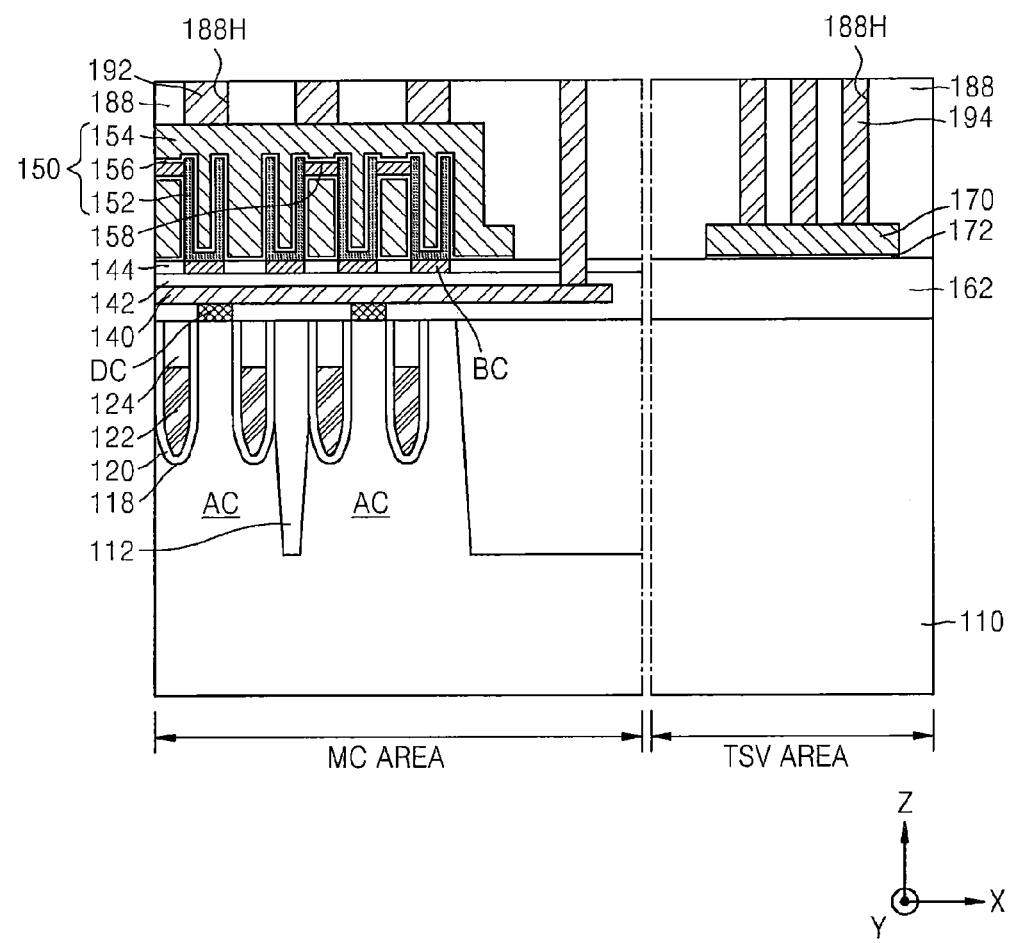

Referring to FIG. 6E, a plurality of contact plugs 192 that are connected to the upper electrode 154 and the bit line 140 are formed in the MC area, and a plurality of contact plugs 194 that are connected to the TSV landing pad 170 are formed in the TSV area.

The contact plugs 192, 194 may be formed of a metal, a conductive metal nitride, or a combination thereof. In some embodiments, at least some of the contact plugs 192 and 194 may have a double layer structure including TiN/W, but the contact plugs 192, 194 are not limited thereto.

In some embodiments, in order to form the contact plugs 192 and 194, a fourth insulating layer 188, which covers the upper electrode 154 and the TSV landing pad 170, may be formed in the MC area and the TSV area, and then a plurality of contact holes 188H may be formed by etching a portion of the fourth insulating layer 188 to expose the upper electrode 154, the bit line 140, and the TSV landing pad 170. Then, a process of filling the contact holes 188H with a conductive material may be performed.

The plurality of contact holes 188H may have a relatively large difference in depth, which may be on the order of, for example several microns. In order to form the contact holes 188H having such a relatively large difference in depth, the fourth insulating layer 188 and the upper electrode 154 may be formed of materials that have a high degree of etching selectivity. For example, in some embodiments, the upper electrode 154 may be formed of SiGe and the fourth insulating layer 188 may be formed of oxide.

Figure 6F:
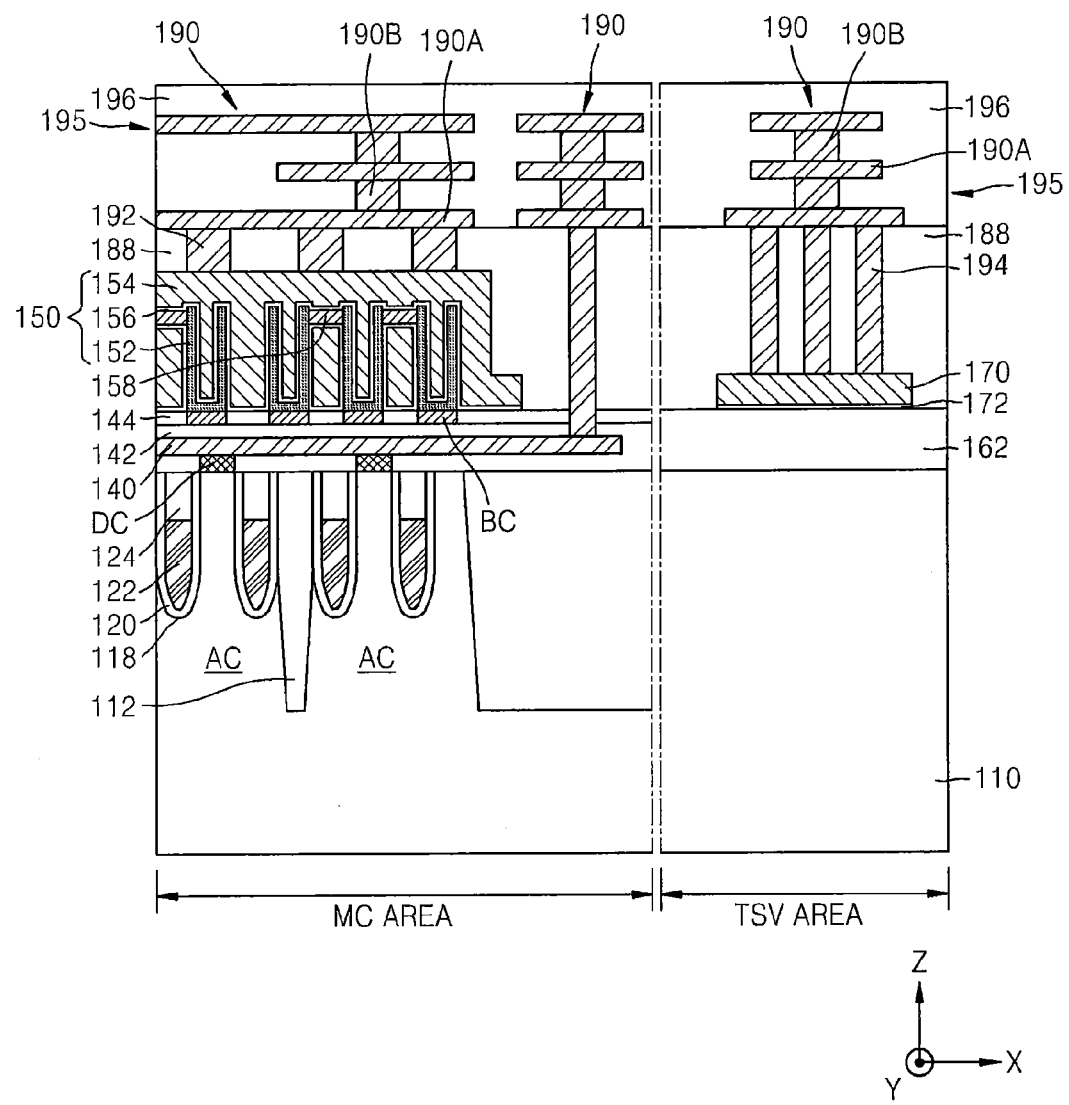

Referring to FIG. 6F, a back-end-of-line (BEOL) structure 195 is formed on the plurality of contact plugs 192 and 194 and the fourth insulating layer 188. The BEOL structure 195 includes a fifth insulating layer 196 and a plurality of multi-layered interconnection structures 190 including a portion that is insulated by the fifth insulating layer 196.

At least some of the multi-layered interconnection structures 190 are electrically connected to the contact plugs 192 and 194. The multi-layered interconnection structures 190 each include a plurality of metal interconnection layers 190A and a plurality of contact plugs 190B.

Although FIG. 6F illustrates multi-layered interconnection structures 190 that each include three metal interconnection layers 190A formed at different levels above the substrate 110, such a structure is illustrated only for the simplification of explanation and the inventive concepts are not limited thereto. In addition, the connection structure between the metal interconnection layers 190A and the contact plugs 190B in the multi-layered interconnection structure 190 illustrated in FIG. 6F is only an example, and the inventive concepts are not limited thereto.

In some embodiments, the metal interconnection layers 190A and the contact plugs 190B may each include at least one metal selected from W, Al, and Cu. In some embodiments, the metal interconnection layers 190A and the contact plugs 190B may be formed of the same material. In other embodiments, at least some of the metal interconnection layers 190A and contact plugs 190B may include different materials.

In some embodiments, a plurality of multi-layered interconnection structures (not shown) that are formed at the same level as the plurality of multi-layered interconnection structures 190 may be formed in the fifth insulating layer 196.

Figure 6G:
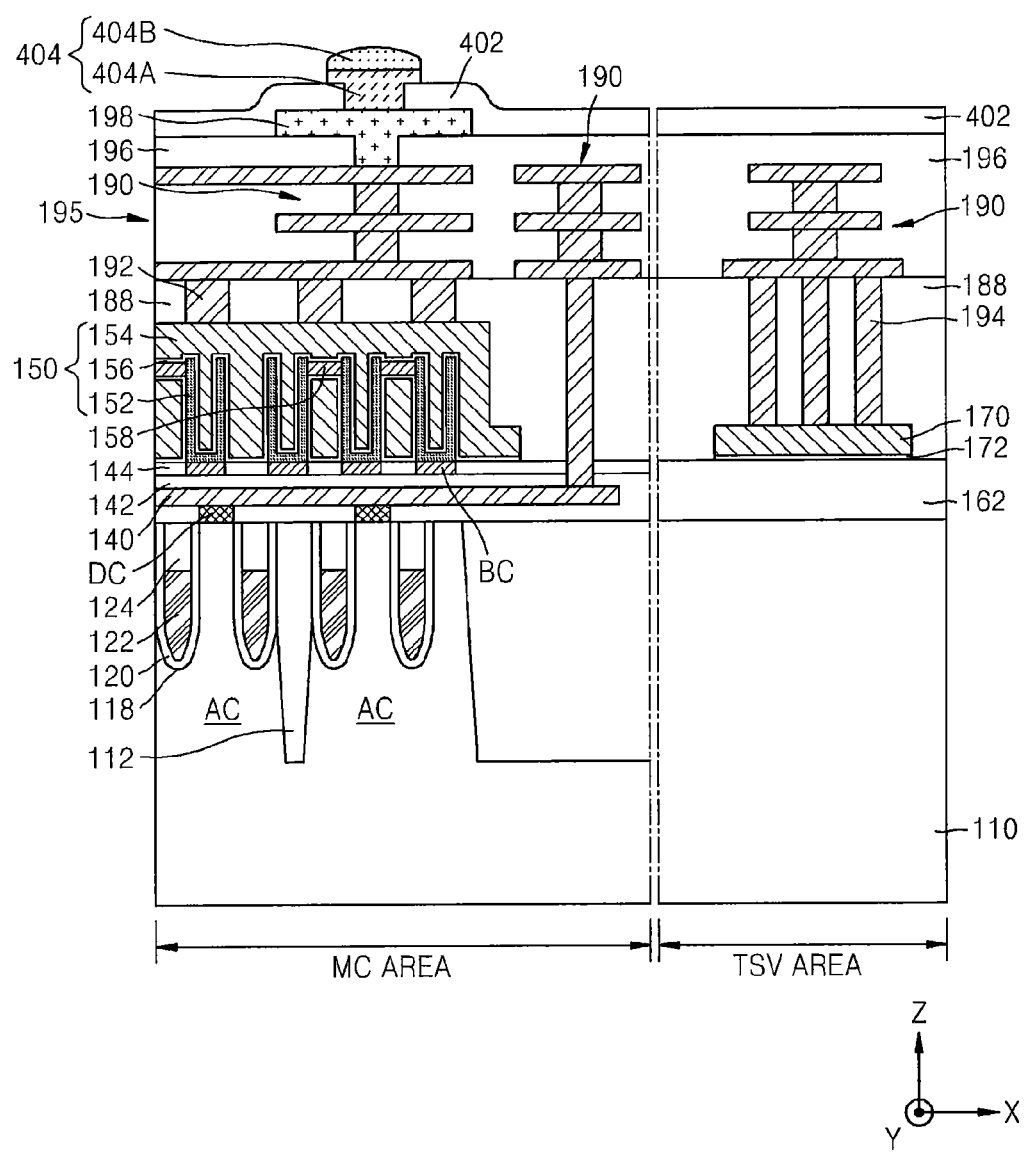

Referring to FIG. 6G, a plurality of contact pads 198 are formed on the fifth insulating layer 196 that are electrically connected to the multi-layered interconnection structure 190. The contact pads 198 may be formed of, for example, Al.

A passivation layer 402 is formed on the BEOL structure 195 that includes openings that expose the contact pads 198. In some embodiments, the passivation layer 402 may be formed of polyimide or silicon nitride.

A plurality of bumps 404 are then formed that are electrically connected to respective ones of the contact pads 198 that are exposed through the passivation layer 402.

The bumps 404 may each have a structure in which a first metal layer 404A and a second metal layer 404B are stacked. In some embodiments, the first metal layer 404A is formed of Cu, Ni, or an alloy thereof. In some embodiments, the second metal layer 404B is formed of Sn, Ag, Pb, Au, Cu, Bi, or an alloy thereof. For example, the second metal layer 404B may be formed of an alloy of Sn and Ag. The first metal layer 404A and the second metal layer 404B may be formed by sequentially performing an electroplating process and a reflow process.

In some embodiments, the bumps 404 may each also include a seed layer (not shown) that is interposed between the contact pad 198 and the first metal layer 404A. The seed layer may have a stacked structure including Ti and Cu or a stacked structure including TiW and Cu. The seed layer may be used as a seed to facilitate forming the first metal layer 404A using an electroplating process.

Figure 6H:
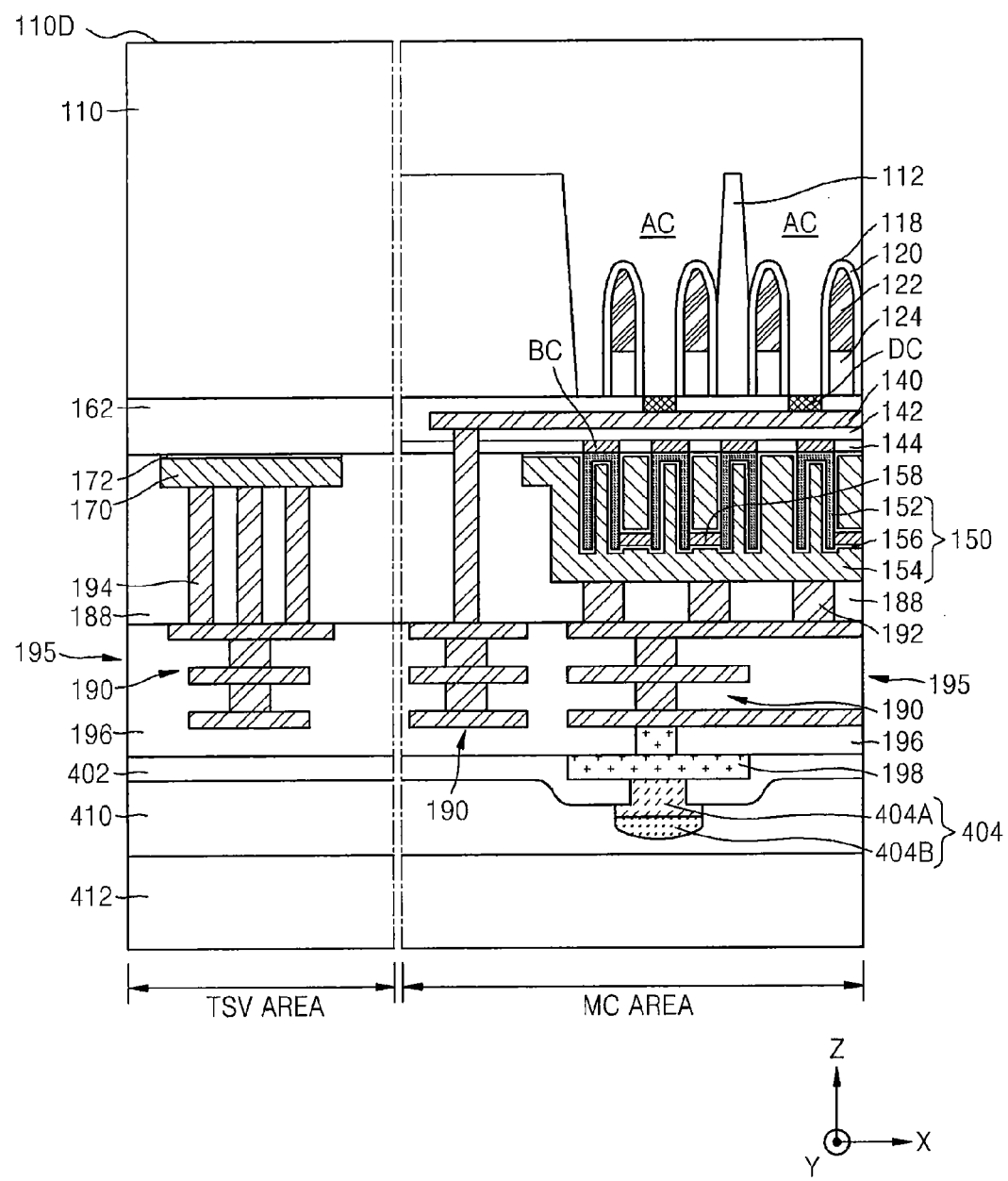

Referring to FIG. 6H, an adhesive coating layer 410 is formed on a surface of the structure of FIG. 6G, and the resultant structure is mounted on a wafer support substrate 412 by using the adhesive coating layer 410 as an adhesive material.

A backlapping process is performed, to a predetermined thickness, on the bottom side of the substrate 110, which is opposite to the side covered with the wafer support substrate 412, to expose a backside 110D of the substrate 110.

Figure 6I:
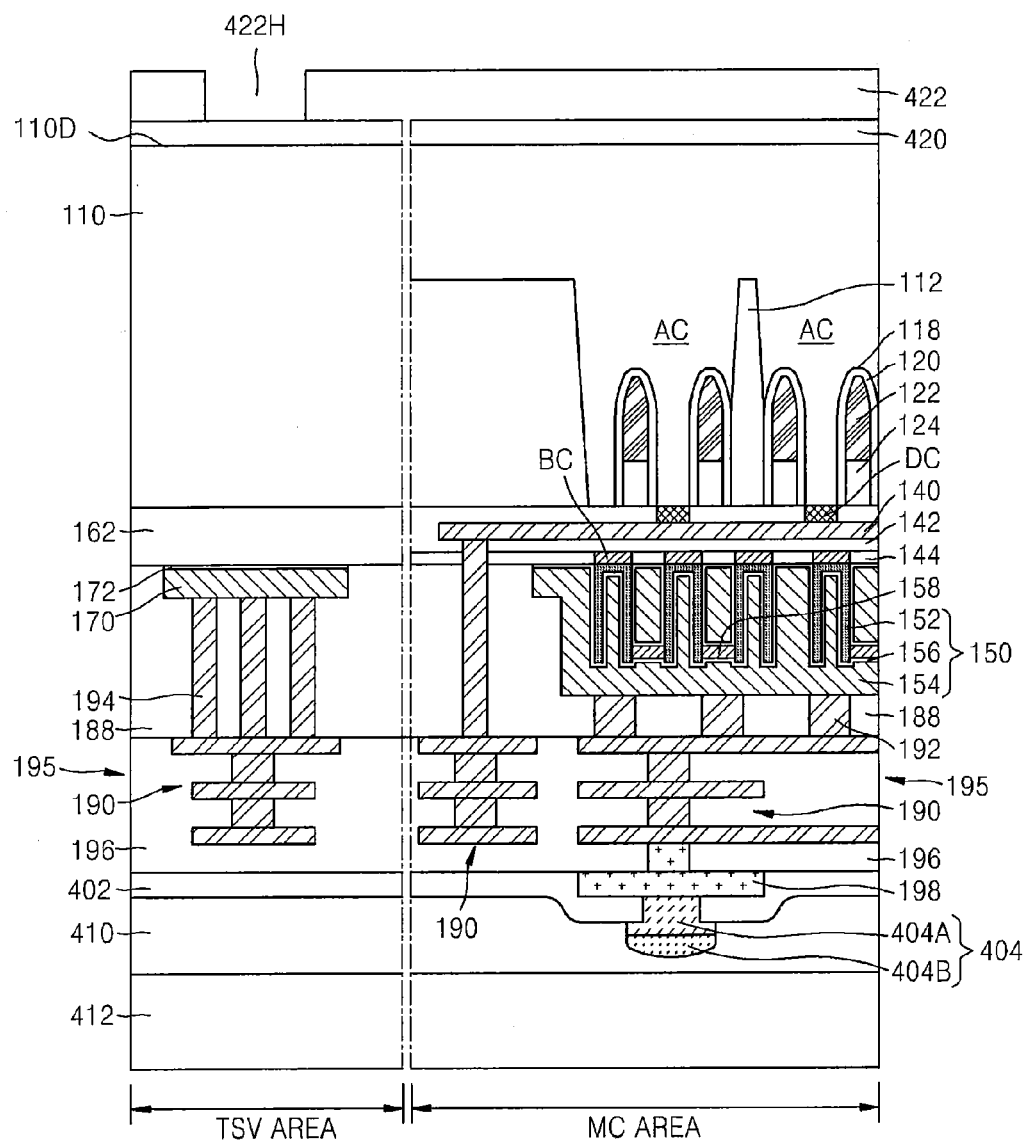

Referring to FIG. 6I, a hard mask layer 420 is formed on the backside 110D of the substrate 110, and a mask pattern 422 is formed on the hard mask layer 420. In the TSV area, at least one hole 422H is provided in the mask pattern 422 that exposes a portion of an upper surface of the hard mask layer 420.

In some embodiments, the hard mask layer 420 may be a silicon nitride layer. The hard mask layer 420 may have a thickness of about 200 Å to about 1000 Å.

In some embodiments, the mask pattern 422 may be formed of photoresist material.

Figure 6J:
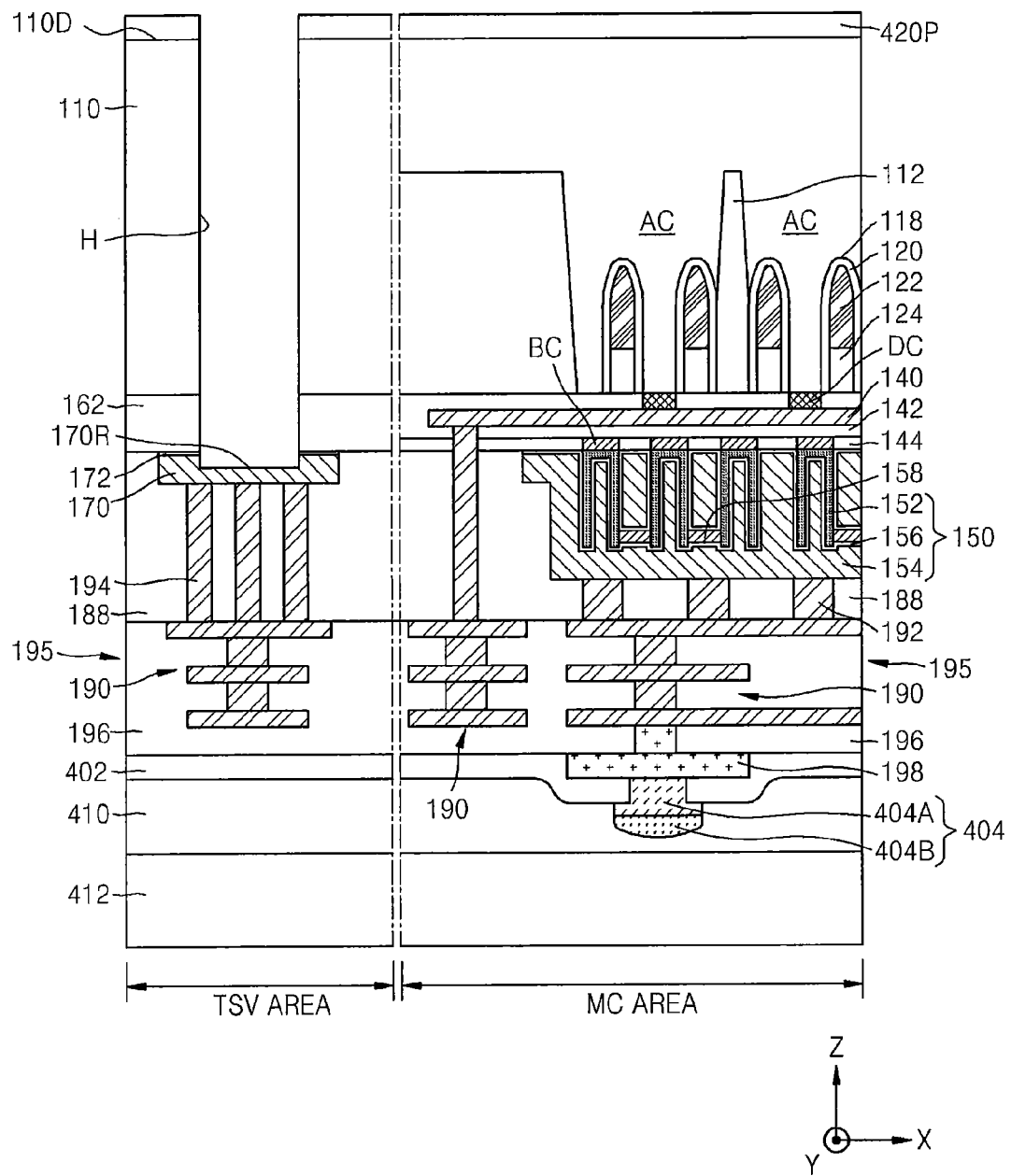

Referring to FIG. 6J, the hard mask layer 420 may then be etched using the mask pattern 422 (refer to FIG. 6I) as an etch mask to form a hard mask pattern 420P. The substrate 110 may then be etched using the mask pattern 422 and the hard mask pattern 420P as an etch mask to form a via hole H that exposes the TSV landing pad 170. The via hole H passes through the substrate 110, the third insulating layer 162, and the TSV area dielectric film 172.

An anisotropic etching process or a laser drilling process may be used to form the via hole H. In some embodiments, a portion of the TSV landing pad 170 may be etched due to over-etching during the etching process that is performed to form the via hole H, and thus, the recessed surface 170R of the TSV landing pad 170 may be exposed at the bottom side of the via hole H.

A width of the via hole H and a depth of the via hole H are not limited to those illustrated in FIG. 6J, but may be variously formed according to need.

Particularly, when forming the via hole H so as to pass through the substrate 110 having a thickness of several tens of microns and the third insulating layer 162 formed on the substrate 110, the amount of etching of the substrate 110 and third insulating layer 162 may be controlled so that the TSV landing pads 170 may be exposed in each of a plurality of via holes H. However, after performing the etching process for forming the plurality of via holes H from the bottom of the substrate 110 toward the inside of the substrate 110, portions of the substrate 110 or third insulating layer 162 may remain on the TSV landing pad 170 without being removed and the remaining portions may have thickness variation, and thus, the TSV landing pads 170 may not be exposed through the via holes H. For example, when the thickness variation is from several microns to several tens of microns, an over-etching may be required to ensure that the TSV landing pad 170 and conductive landing pads formed in other positions to correspond to the TSV landing pad 170 are exposed through the via holes H. However, if the thickness of the TSV landing pads 170 is relatively small, the via hole H may pass through the TSV landing pad 170 due to the over-etching, and thus, the TSV landing pad 170 may not perform an intended function. Particularly, integrated circuit devices are gradually being miniaturized and thinned, and thus, thicknesses of interconnection lines are gradually becoming smaller. Accordingly, technical difficulties in the process of forming the via hole H for exposing the TSV landing pad 170 may greatly increase.

According to the present embodiment of the inventive concepts, the TSV landing pad 170 is formed of the same material as the upper electrode 154 of the capacitors 150, which is formed in the MC area, and is formed at the same time as the upper electrode 154, and has a relatively large thickness of at least 100 nm. Accordingly, although an over-etching is performed until the TSV landing pad 170 and the conductive landing pads formed in other positions are exposed through all of the via holes H, to solve a problem due to the thickness variation that may occur while performing an etching process for forming the plurality of via holes H, a deformation that may have an influence on the function of the TSV landing pad 170 does not occur in the TSV landing pad 170 having a relatively large thickness. Accordingly, the problem due to the thickness variation that may occur while performing an etching process for forming the plurality of via holes H may be ameliorated.

In addition, when the TSV landing pad 170 includes a metal contaminant (e.g., Cu) that may have a negative influence on the substrate 110, a metal contaminant source, which is generated from the TSV landing pad 170 while performing an etching or over-etching process for forming the via hole H until the TSV landing pad 170 is exposed, may permeate into the substrate 110, which is exposed through a sidewall of the via hole H and thus may have a negative influence on the integrated circuit devices. However, according to the present embodiment of the inventive concepts, a bottom side of the TSV landing pad 170 which is adjacent to the substrate 110 may include a non-metallic conductive material, e.g., SiGe. Accordingly, the non-metallic material functions as an etch stop layer during the etching or over-etching process that is used to form the via hole H and expose the TSV landing pad 170, and thus, the metal contaminant source may not permeate into the substrate 110, which is exposed through a sidewall of the via hole H, although the TSV landing pad 170 is exposed through the via hole H. Accordingly, the likelihood that the substrate 110 is contaminated with a metal while forming the via hole H to form a TSV structure may be reduced.

After the via hole H is formed in the process of FIG. 6J, the mask pattern 422 (refer to FIG. 6I) is removed to expose an upper surface of the hard mask pattern 420P.

Figure 6K:
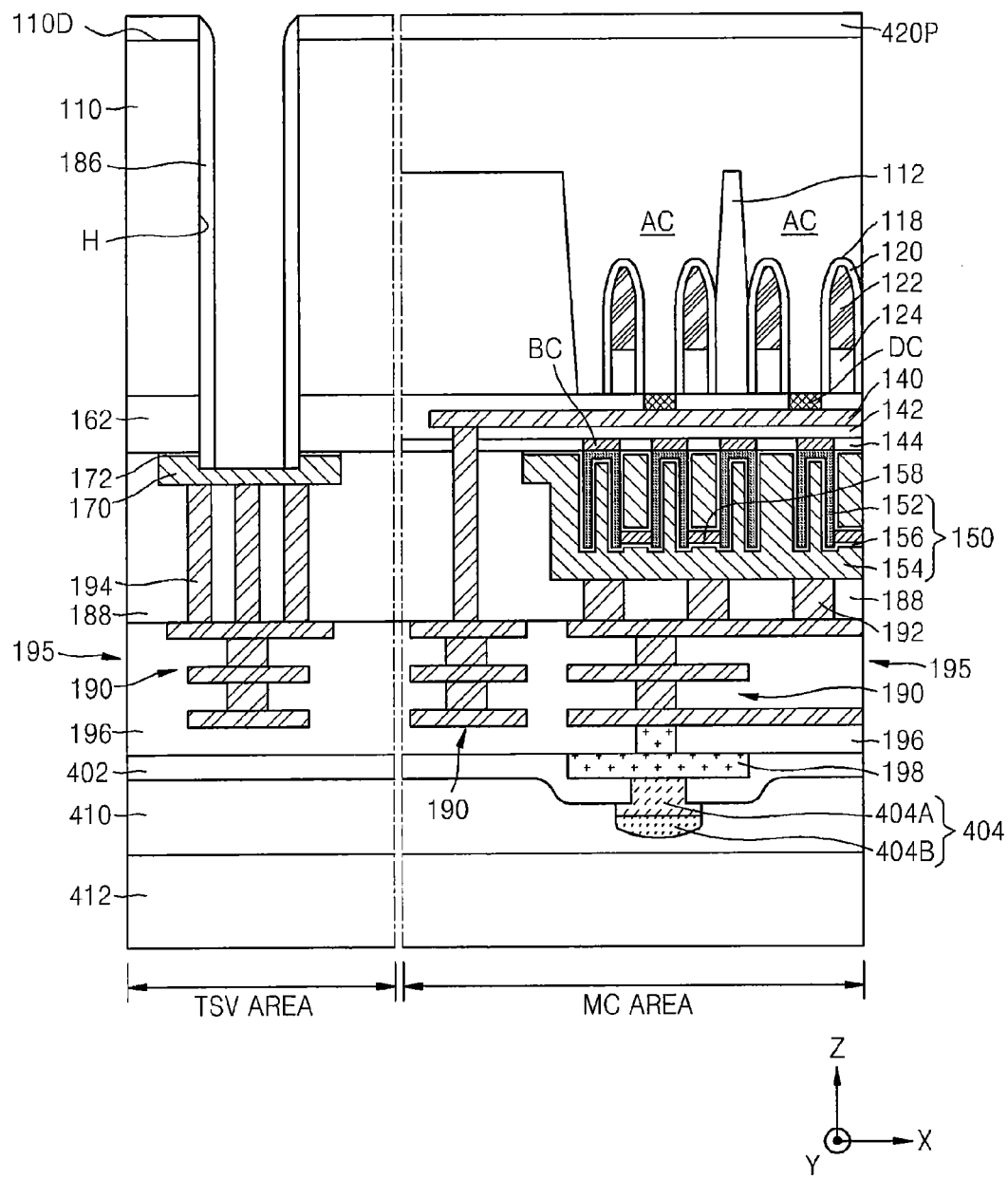

Referring to FIG. 6K, a via insulating layer 186 is formed to cover an inner sidewall of the via hole H.

In some embodiments, in order to form the via insulating layer 186, an insulating layer (not shown), which covers an inner wall of the via hole H and a backside 110D of the substrate 110, may be formed by using a chemical vapor deposition (CVD) process, and then a portion of the insulating layer may be removed so that the TSV landing pad 170 is exposed in the via hole H. In some embodiment, an anisotropic ion etching process may be used to remove the portion of the insulating layer.

In some embodiments, the via insulating layer 186 may be a silicon oxide layer.

Figure 6L:
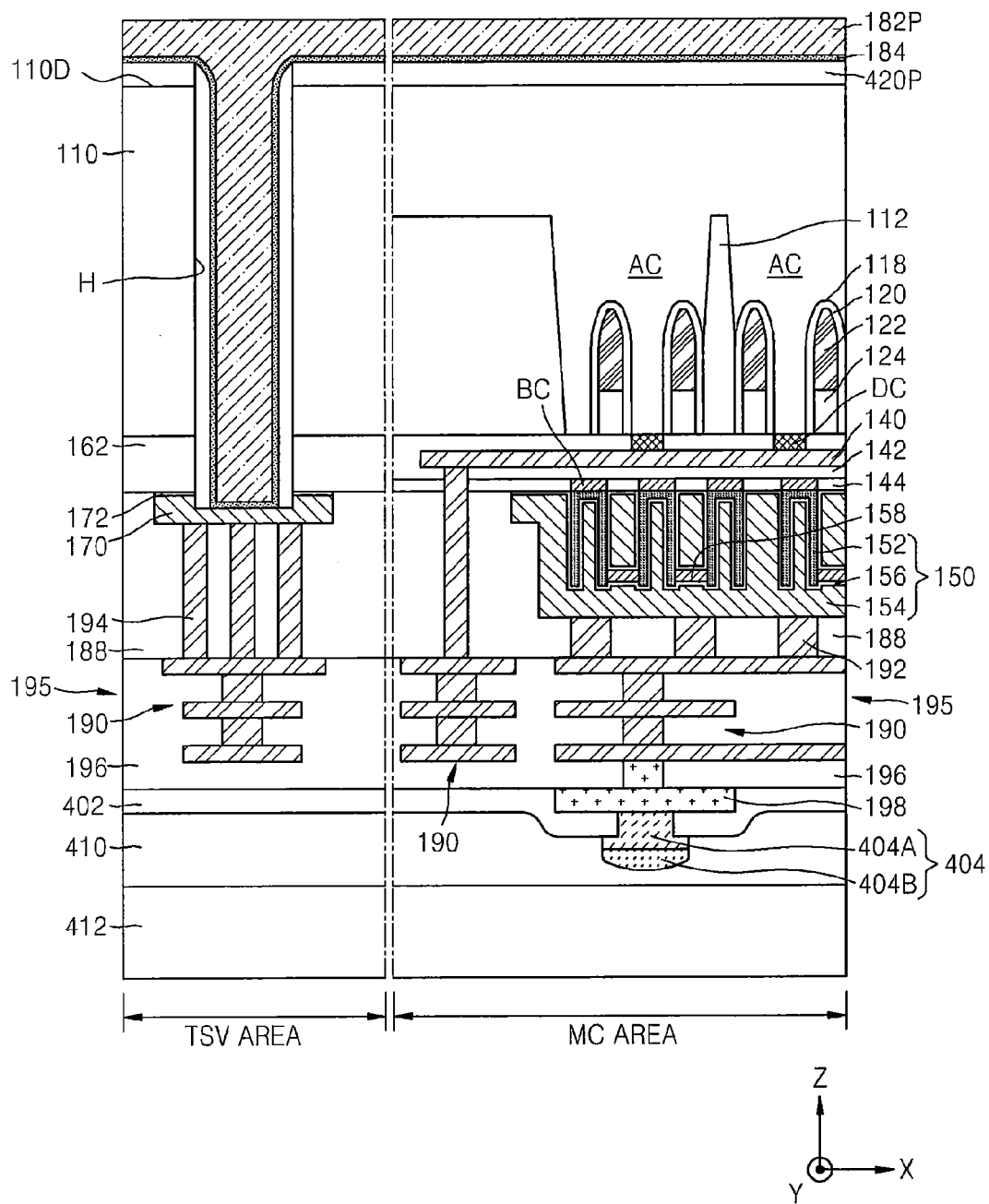
Figure 6M:
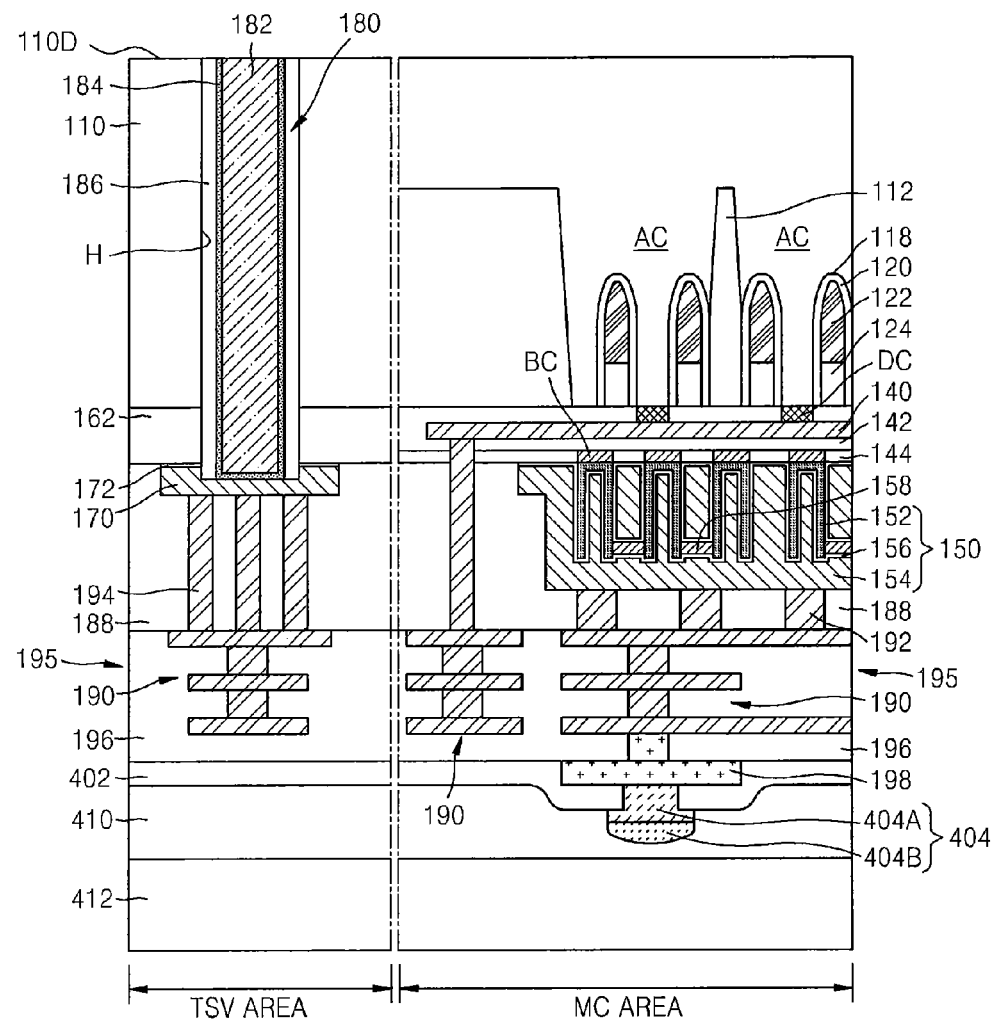
Figure 6M:
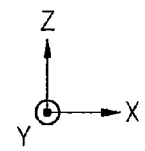

Referring to FIG. 6L, a conductive barrier film 184 is formed inside the via hole H, and a conductive layer 182P for the formation of a TSV is formed on the conductive barrier film 184.

The conductive barrier film 184 covers the via insulating layer 186 and the TSV landing pad 170, which are exposed in the via hole H. In the present embodiment, the conductive barrier film 184 extends outside the via hole H on the hard mask pattern 420P. However, the inventive concepts are not limited thereto. In some embodiments, the conductive barrier film 184 may be formed only inside the via hole H.

In order to form the conductive layer 182P, a seed layer (not shown) may be formed on the conductive barrier film 184. The seed layer may cover the conductive barrier film 184 inside and outside the via hole H. In some embodiments, the seed layer 140 may have a stacked structure of Ta and Cu or a stacked structure of Ti and Cu. In some embodiments, the seed layer may be formed via a physical vapor deposition (PVD) process. The conductive layer 182P may be formed via an electroplating process on the seed layer. The conductive layer 182P may be formed to a thickness that is sufficient to fill the via hole H. In some embodiments, the conductive layer 182P may be formed of Cu. For example, in order to form the conductive layer 182P, a Cu layer may be formed on a surface of the seed layer using an electroplating process.

In some embodiments, the conductive layer 182P may be formed of W or Al. In such embodiments, the seed layer may be omitted. For example, the conductive layer 182P may be formed only on the conductive barrier film 184 by using a PVD process.

Referring to 6M, a chemical mechanical polishing (CMP) process may then be performed until the backside 110D of the substrate 110 is exposed. This CMP process may remove portions of the conductive barrier film 184 and the conductive layer 182 that are outside of the via hole H to form the TSV structure 180 in the via hole H. The TSV structure 180 includes a conductive plug 182 (i.e., a portion of the conductive layer 182P remaining in the via hole H) and a conductive barrier film 184 that surrounds the conductive plug 182.

Figure 7A:
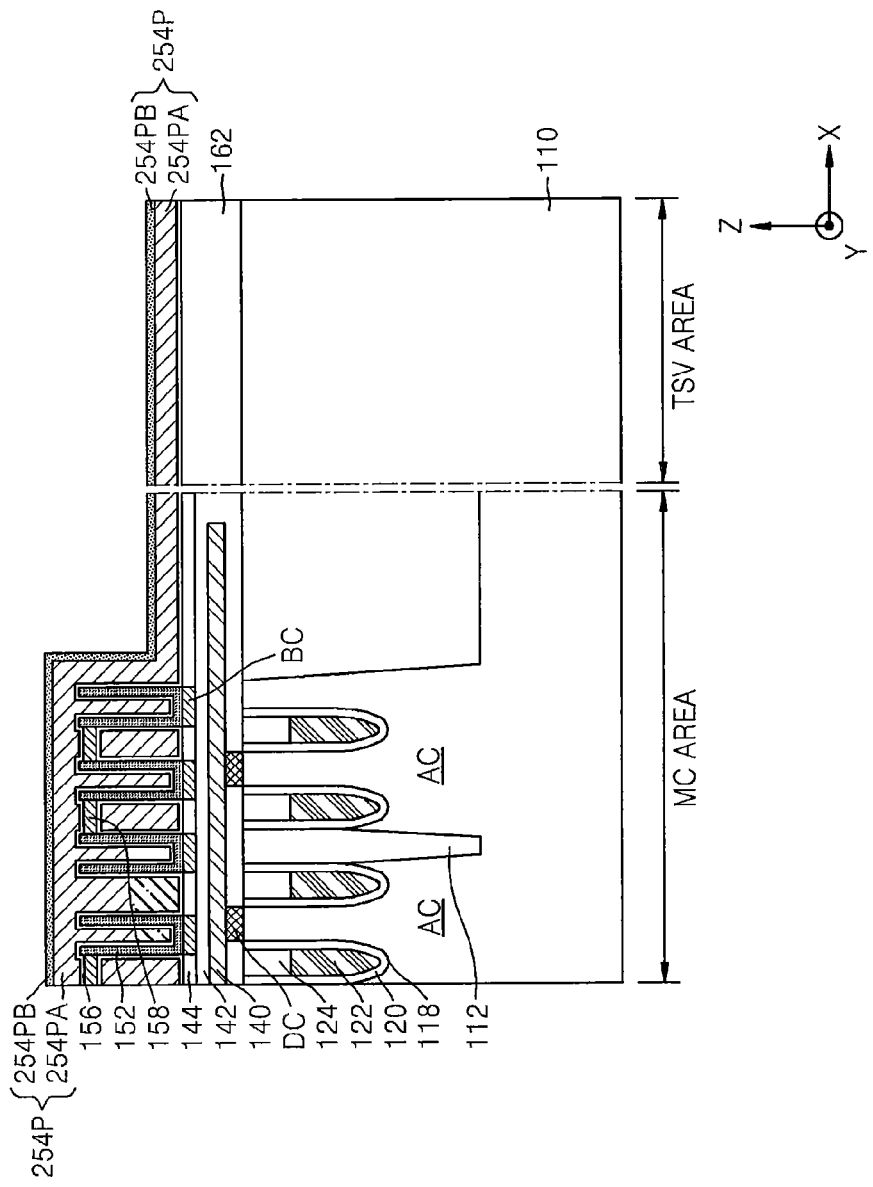
FIGS. 7A through 7C are cross-sectional views that sequentially illustrate a method of manufacturing an integrated circuit device according to another embodiment of the inventive concepts.
Figure 7B:
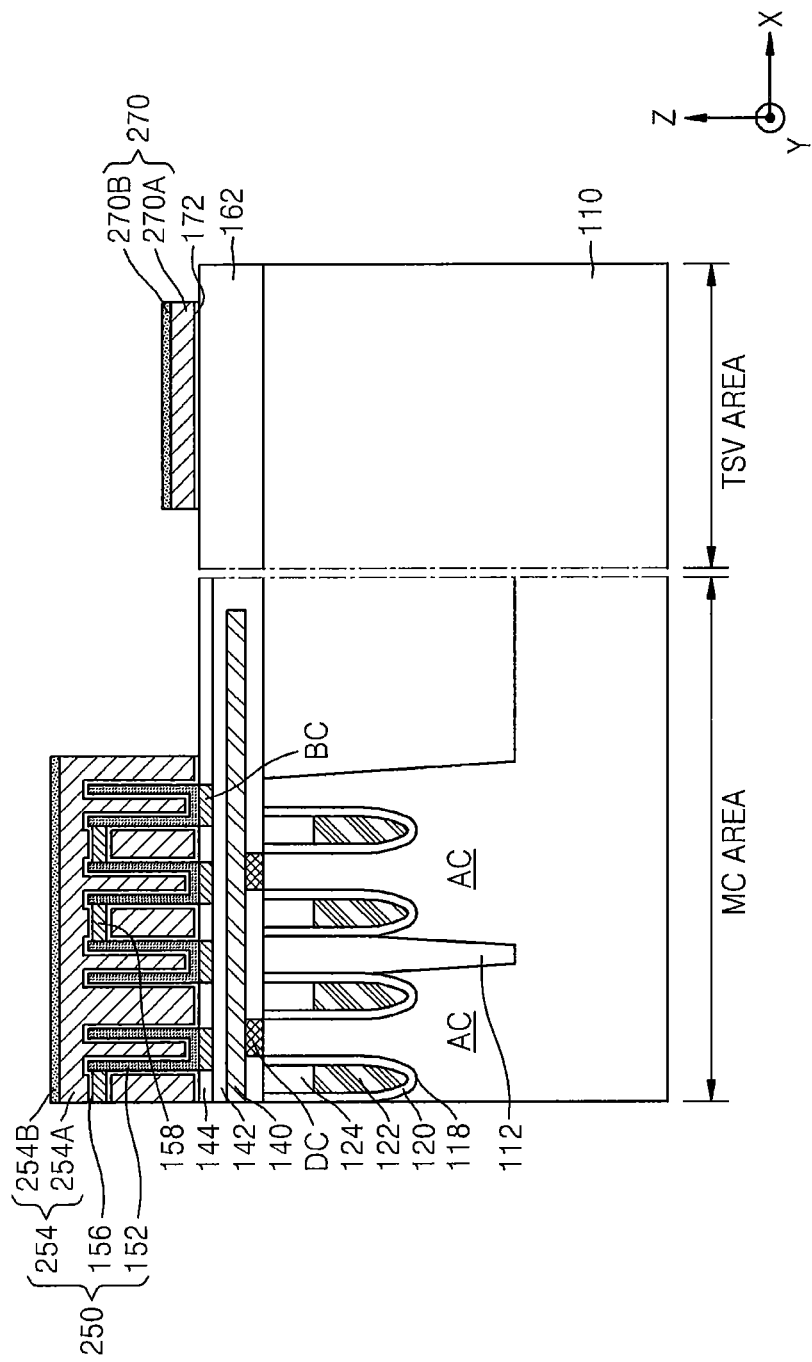
Figure 7C:
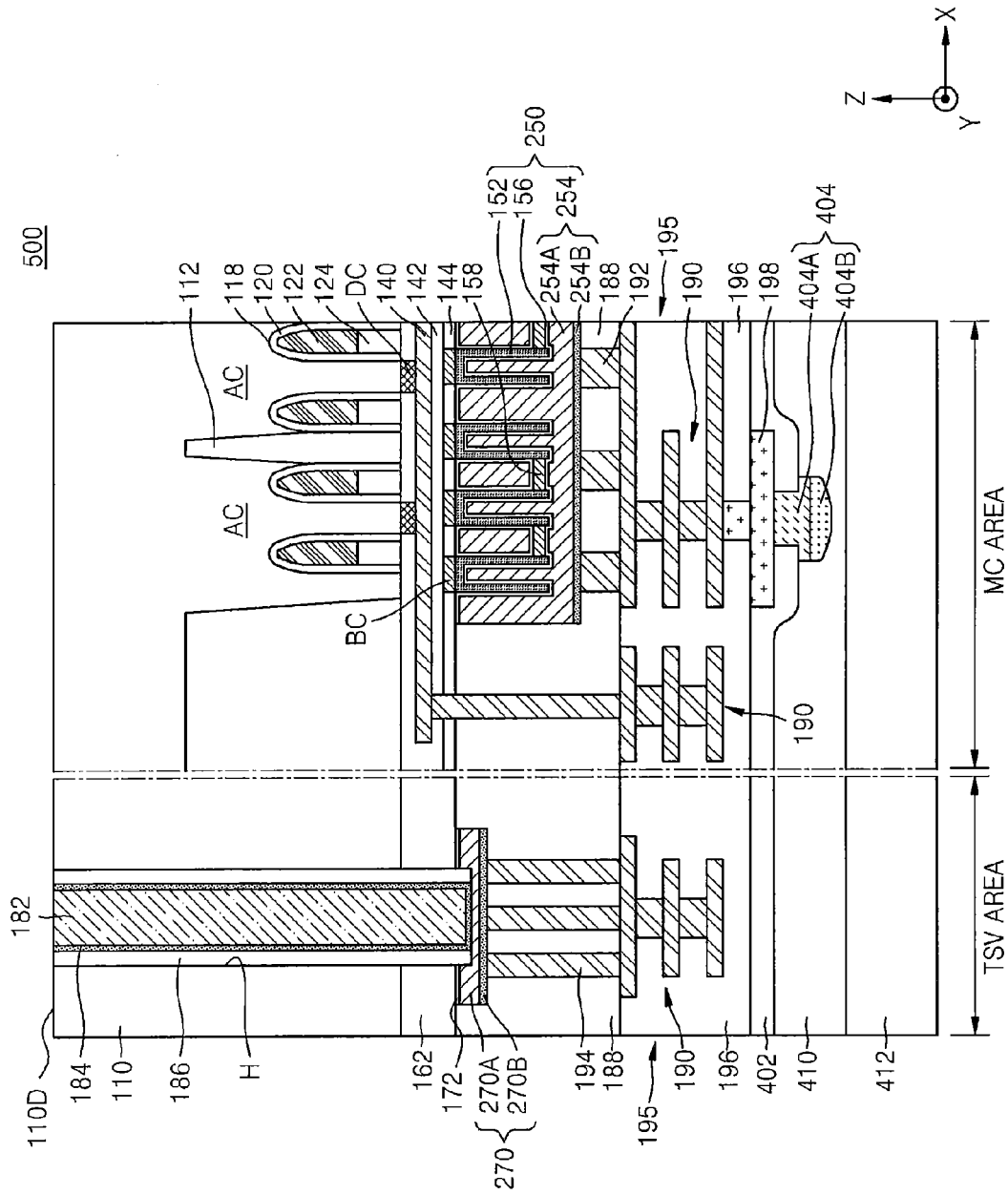

FIGS. 7A through 7C are cross-sectional views which sequentially illustrate a method of manufacturing an integrated circuit device 500 (refer to FIG. 7C) according to another embodiment of the inventive concepts. In FIGS. 7A through 7C, the same reference numerals are used to denote the same elements as in FIGS. 2, 4, and 6A through 6M, and thus, detailed descriptions of these elements will be omitted.

Referring to FIG. 7A, a resultant structure including a plurality of lower electrodes 152 that is formed in an MC area of a substrate 110 is obtained by using processes as described with reference to FIGS. 6A and 6B.

Next, a dielectric film 156 is formed in the MC area and the TSV area by using a process as described with reference to FIG. 6C. Then, an upper electrode layer 254P is formed on the dielectric film 156 by using a method similar to that used for forming the upper electrode layer 154P illustrated in FIG. 6C. The upper electrode layer 254P has approximately the same structure as the upper electrode layer 154P illustrated in FIG. 6C, except that it is a multi-layer upper electrode layer that includes a first conductive layer 254PA and a second conductive layer 254PB.

In some embodiments, the first conductive layer 254PA may be a non-metallic conductive layer, and the second conductive layer 254PB may be formed of a metal, a metal silicide, or a combination thereof. For example, the first conductive layer 254PA may be formed of SiGe, and the second conductive layer 254PB may include at least one conductive material selected from W, Ni, and silicides thereof.

Referring to FIG. 7B, a plurality of capacitors 250 and a TSV landing pad 270 are formed using the method described above with reference to FIG. 6D. In more detail, the upper electrode layer 254P and the dielectric film 156 are patterned in the MC area and the TSV area, and thus, a plurality of capacitors 250, which include a plurality of lower electrodes 152, an upper electrode 254P, and the dielectric film 156 interposed therebetween, are formed in the MC area and the TSV landing pad 270 is formed in the TSV area.

The multi-layer upper electrode 254P of the capacitors 250 includes the first conductive layer 254PA and the second conductive layer 254PB. The TSV landing pad 270 includes a first pad layer 270A formed of the same material as the first conductive layer 254PA and a second pad layer 270B formed of the same material as the second conductive layer 254PB.

At least one of the first pad layer 270A and the second pad layer 270B may have a structure that is the same as or similar to that of any one of the landing pads 372, 374, 376, and 378 illustrated in FIGS. 5A through 5D.

A TSV area dielectric film 172, which is formed during the patterning of the dielectric film 156 that is formed in the process of FIG. 7A, remains between the TSV landing pad 270 and a third insulating layer 162 in the TSV area.

Referring to FIG. 7C, processes similar to those described with reference to FIGS. 6E through 6M are performed on a resultant structure of FIG. 7B to form the integrated circuit device 500.

In the integrated circuit device 500, the TSV landing pad 270 may have a dual layer structure including the first pad layer 270A and the second pad layer 270B. The first pad layer 270A is closer to the substrate 110 and may be formed of a non-metallic material, and the second pad layer 270B may be formed of metal or metal silicide. The TSV landing pad 270 may have a relatively large thickness of at least 100 nm. Accordingly, similarly as described with reference to FIG. 6I, even when over-etching is performed to solve thickness variation occurring due to a difference in the etching amount of the substrate 110 and third insulating layer 162 while performing an etching process for forming a plurality of via holes H, a deformation that may have an influence on the function of the TSV landing pad 270 does not occur in the TSV landing pad 270 having a relatively large thickness. Since the first pad layer 270A formed of the non-metallic material is exposed through the via hole H after the formation of the via hole H, the possibility that the substrate 110 is contaminated with a metal may be reduced. In addition, since the TSV landing pad 270 includes the second pad layer 270B formed of metal or metal silicide on the first pad layer 270A, resistance characteristics of the TSV landing pad 270 may be improved.

Figure 8:
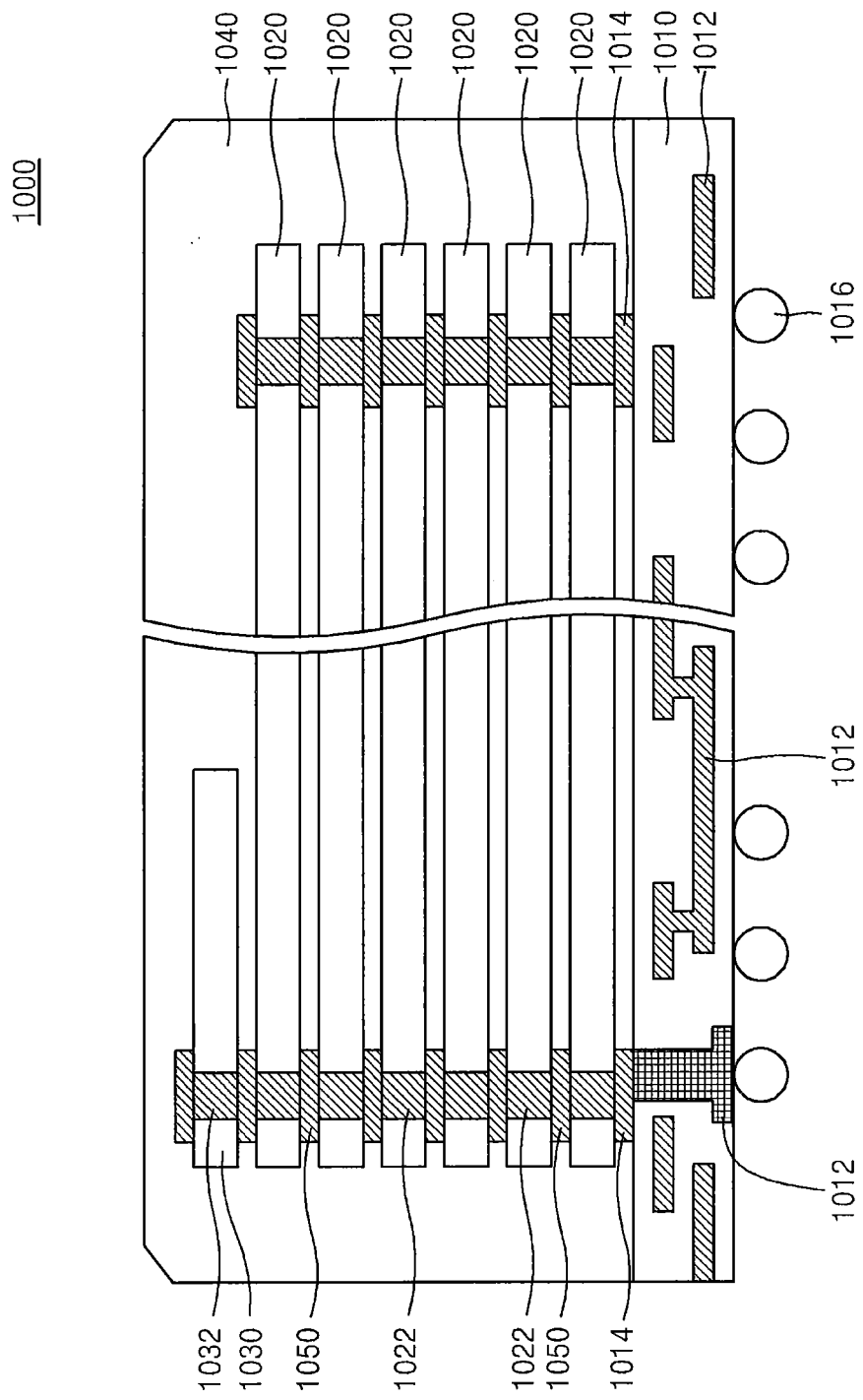
FIG. 8 is a cross-sectional view illustrating selected elements of an integrated circuit device according to embodiments of the inventive concepts.

FIG. 8 is a cross-sectional view illustrating selected elements of an integrated circuit device 1000 according to an embodiment of the inventive concepts.

Referring to FIG. 8, the integrated circuit device 1000 includes a plurality of semiconductor chips 1020 that are sequentially stacked on a package substrate 1010. A control chip 1030 may be connected to the semiconductor chips 1020. The stacked structure of the semiconductor chips 1020 and the control chip 1030 may be sealed by an encapsulant 1040, such as a thermosetting resin, on the package substrate 1010. In FIG. 8, six semiconductor chips 1020 are vertically stacked. However, the number of the semiconductor chips 1020 and the stacking direction thereof are not limited thereto. The semiconductor chips 1020 may be arranged on the package substrate 1010 in a horizontal direction, a vertical direction, or a combination thereof. In some embodiments, the control chip 1030 may be omitted.

The package substrate 1010 may be, for example, a flexible printed circuit board, a rigid printed circuit board, or a combination thereof. The package substrate 1010 may include a substrate inner interconnection line 1012 and a connection terminal 1014. The connection terminal 1014 may be formed on a surface of the package substrate 1010. On another surface of the package substrate 1010, one or more solder balls 1016 may be formed. The connection terminal 1014 may be electrically connected to a solder ball 1016 through the substrate inner interconnection line 1012.

In some embodiments, the solder balls 1016 may be replaced with a conductive bump or a lead grid array (LGA).

At least one of the semiconductor chips 1020 and the control chip 1030 may include at least one of the integrated circuit devices 10, 100, 200, 400, and 500 described above with reference to FIGS. 1 through 7C.

The semiconductor chips 1020 and the control chip 1030 include TSV connection structures 1022 and 1032. The TSV connection structures 1022 and 1032 may be electrically connected to the connection terminal 1014 of the package substrate 1010 by connection members 1050.

The semiconductor chips 1020 may include, for example, a system LSI, flash memory, dynamic random-access memory (DRAM), static RAM (SRAM), electrically erasable programmable read-only memory (EEPROM), phase-change RAM (PRAM), magnetoresistive RAM (MRAM), or resistive RAM (RRAM). The control chip 1030 may include a logic circuit, such as a serializer/deserializer (SER/DES) circuit.

Figure 9:
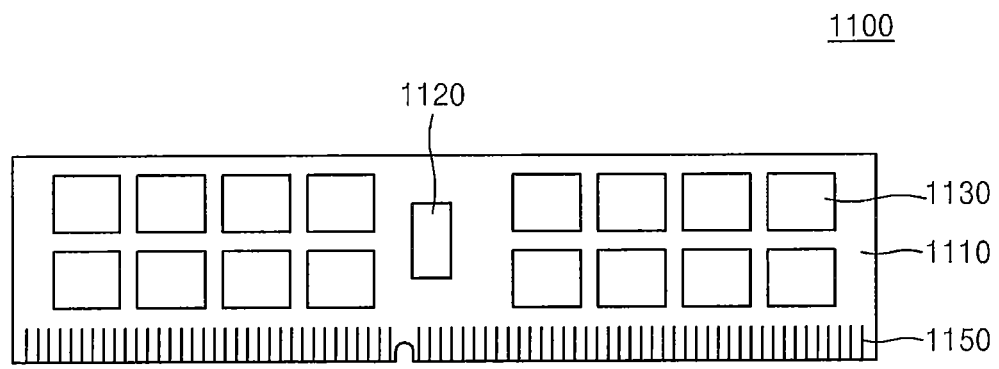
FIG. 9 is a plan view illustrating selected elements of an integrated circuit device according to further embodiments of the inventive concepts.

FIG. 9 is a plan view illustrating selected elements of an integrated circuit device 1100 according to another embodiment of the inventive concepts.

The integrated circuit device 1100 includes a module substrate 1110, a control chip 1120 mounted on the module substrate 1110, and a plurality of semiconductor packages 1130. The module substrate 1110 includes a plurality of input and output terminals 1150.

The semiconductor packages 1130 may include at least one of the integrated circuit devices 10, 100, 200, 400, and 500 described above with reference to FIGS. 1 through 7C.

Figure 10:
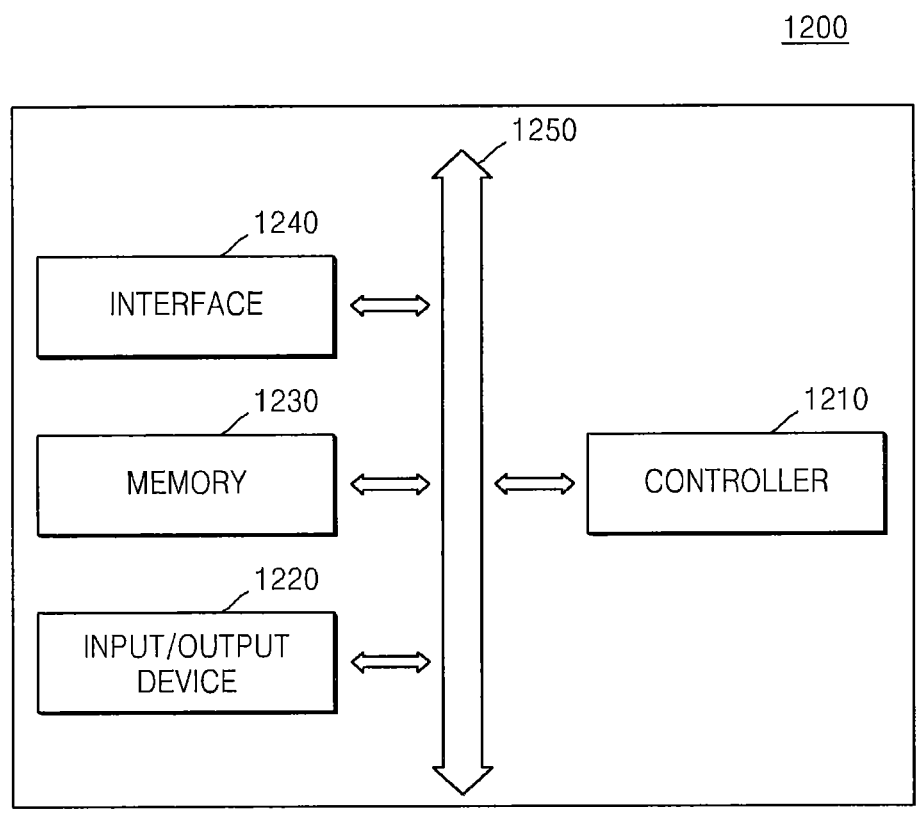
FIG. 10 is a diagram illustrating selected elements of an integrated circuit device according to still further embodiments of the inventive concepts.

FIG. 10 is a diagram illustrating selected elements of an integrated circuit device 1200 according to still further embodiments of the inventive concepts.

The integrated circuit device 1200 may include a controller 1210, an input/output device 1220, a memory 1230, and an interface 1240. The integrated circuit device 1200 may be a mobile system or a system that transmits or receives information. In some embodiments, the mobile system may include at least one selected from a personal digital assistant (PDA), a portable computer, a web tablet, a wireless phone, a mobile phone, a digital music player, and a memory card.

In some embodiments, the controller 1210 may be a microprocessor, a digital signal processor, or a micro-controller.

The input/output device 1220 may be used to input data to and output data from the integrated circuit device 1200. The integrated circuit device 1200 may be connected to an external device, for example, a personal computer or a network by using the input/output device 1220, and may exchange data with the external device. In some embodiments, the input/output device 1220 may be a keypad, a keyboard, or a display.

In some embodiments, the memory 1230 may store code and/or data for the operation of the controller 1210. In other embodiments, the memory 1230 stores data that is processed by the controller 1210. The controller 1210 and the memory 1230 may each include at least one of the integrated circuit devices 10, 100, 200, 400, and 500 described above with reference to FIGS. 1 through 7C.

The interface 1240 functions as a data transmission passage between the integrated circuit device 1200 and other external devices. The controller 1210, the input/output device 1220, the memory 1230, and the interface 1240 may communicate with each other via a bus 1250.

The integrated circuit device 1200 may be included in a mobile phone, an MP3 player, a navigation system, a portable multimedia player (PMP), a solid state disk (SSD), or a household appliance.

While the inventive concepts have been particularly shown and described with reference to exemplary embodiments thereof, it will be understood that various changes in form and details may be made therein without departing from the spirit and scope of the following claims.

What is claimed is:

1. An integrated circuit device comprising:
a capacitor comprising an electrode on a substrate;
a through-silicon-via (TSV) landing pad on the substrate, the TSV landing pad comprising the same material as the electrode;
a multi-layered interconnection structure on the TSV landing pad; and
a TSV structure passing through the substrate, the TSV structure being connected to the multi-layered interconnection structure through the TSV landing pad,
wherein the electrode and the TSV landing pad each comprise a first non-metallic conductive layer and a second conductive layer that includes at least one metal,
wherein the first conductive layer is closer to the substrate compared to the second conductive layer.

2. The integrated circuit device of claim 1, wherein the capacitor comprises a lower electrode connected to an active region of the substrate, an upper electrode on the lower electrode, and a dielectric film interposed between the lower electrode and the upper electrode,
wherein the TSV landing pad comprises the same material as the upper electrode.

3. The integrated circuit device of claim 1, further comprising a bit line between the substrate and the capacitor on the substrate,
wherein a thickness of the TSV landing pad is larger than a thickness of the bit line.

4. The integrated circuit device of claim 1, wherein the first conductive layer is interposed between the substrate and the second conductive layer.

5. The integrated circuit device of claim 1, wherein the TSV structure has an upper surface having a first portion that directly contacts the TSV landing pad and a second portion that is spaced apart from the TSV landing pad.

6. The integrated circuit device of claim 1, wherein at least a portion of the TSV landing pad comprises a mesh pattern.

7. The integrated circuit device of claim 1, wherein at least a portion of the TSV landing pad comprises a plurality of spaced apart patterns.

8. The integrated circuit device of claim 2, further comprising a contact plug connected between an interconnection line of the multi-layered interconnection structure and the TSV landing pad, and wherein a portion of the upper electrode in a memory cell area of the integrated circuit device has a thickness that is substantially equal to a thickness of the landing pad.

9. The integrated circuit device of claim 1, further comprising a TSV area dielectric film on a surface of the TSV landing pad that faces the substrate,
wherein the TSV area dielectric film comprises the same material as a dielectric film of the capacitor.

10. An integrated circuit device comprising:
a substrate comprising first and second areas having different pattern formation densities;
a first insulating layer on the first area of the substrate;
a second insulating layer on the second area of the substrate;
a capacitor on the first insulating layer;
a through-silicon-via (TSV) landing pad on the second insulating layer, the TSV landing pad comprising the same material as an electrode of the capacitor;
a multi-layered interconnection structure on the TSV landing pad; and
a TSV structure passing through the substrate and the second insulating layer, the TSV structure being connected to the multi-layered interconnection structure through the TSV landing pad; and
a TSV area dielectric film on a surface of the TSV landing pad that faces the substrate,
wherein the TSV area dielectric film comprises the same material as a dielectric film of the capacitor.

11. The integrated circuit device of claim 10, wherein the first area is a memory cell array area, and the second area is a TSV area that is spaced apart from the memory cell array area.

12. An integrated circuit device, comprising:
a substrate having a device region and a through-silicon-via (TSV) region;
a plurality of capacitors on the substrate in the device region, the capacitors having first electrodes, and a common second electrode;
a TSV landing pad on the substrate in the TSV region, the TSV landing pad formed of the same material as the common second electrode;
a first contact plug on the common second electrode opposite the substrate;
a second contact plug on the TSV landing pad opposite the substrate; and
a TSV structure passing through the substrate to connect to the TSV landing pad.

13. The integrated circuit device of claim 12, wherein the common second electrode is a multi-layer electrode that includes a first non-metallic layer and a second metal-containing layer that is on the first non-metallic layer opposite the substrate.

14. The integrated circuit device of claim 13, wherein the first non-metallic layer comprises a SiGe layer and wherein a portion of the second electrode in the device region has a thickness that is substantially equal to a thickness of the TSV landing pad.

15. The integrated circuit device of claim 13, wherein one of the first non-metallic layer and the second metal-containing layer is a continuous layer and the other of the first non-metallic layer and the second metal-containing layer is a discontinuous layer.

16. The integrated circuit device of claim 12, wherein a central portion of a first side of the TSV landing pad that is closest to the substrate is recessed.

17. The integrated circuit device of claim 10, wherein the TSV landing pad comprises a multi-layer landing pad in which at least two conductive layers that are formed of different materials are stacked.

18. The integrated circuit device of claim 12, further comprising a TSV area dielectric film on a surface of the TSV landing pad that faces the substrate,
  wherein the TSV area dielectric film comprises the same material as a dielectric film of a first of the plurality of capacitors.

19. The integrated circuit device of claim 12, further comprising a bit line between the substrate and a first of the plurality of capacitors,
  wherein a thickness of the TSV landing pad is larger than a thickness of the bit line.

* * * * *